United States Patent [19]

Nishikawa

[11] Patent Number: 6,122,443
[45] Date of Patent: Sep. 19, 2000

[54] WIRE LENGTH MINIMIZATION APPARATUS AND METHOD

[75] Inventor: Takeichiro Nishikawa, Yokohama, Japan

[73] Assignee: Kabushiki Kaisha Toshiba, Kawasaki, Japan

[21] Appl. No.: 09/122,634

[22] Filed: Jul. 27, 1998

[30] Foreign Application Priority Data

Jul. 28, 1997 [JP] Japan .................................... 9-201518
Dec. 17, 1997 [JP] Japan .................................... 9-347851

[51] Int. Cl.$^7$ .................................................. G06F 9/455
[52] U.S. Cl. ............................... 395/500.09; 395/500.08; 395/500.03
[58] Field of Search .............................. 395/500, 500.03, 395/500.04, 500.05, 500.06, 500.08, 500.09, 500.13; 364/491

[56] References Cited

U.S. PATENT DOCUMENTS

| | | | |
|---|---|---|---|
| 5,450,535 | 9/1995 | North | 345/440 |
| 5,535,134 | 7/1996 | Cohn et al. | 364/491 |
| 5,859,781 | 1/1999 | D'Haeseleer et al. | 364/491 |

OTHER PUBLICATIONS

Schiele; "Improved Compaction by Minimized Length of Wires", Proc. 20th Design Automation Conference, 1983, pp. 121–127.

Lakhani et al.; "A Wire–Length Minimization Algorithm For Circuit Layout Compaction", IEEE International Symposium on Circuits and Systems, (1987), vol. 1, pp. 276–279.
Lee et al.; "A Performance–Aimed Cell Compactor With Automatic Jogs", IEEE Transactions on Computer–Aided Design, vol. 11, No. 12, Dec. 1992, pp. 1495–1507.
Mogaki et al, "A Layout Improvement Method Based on Constraint Propagation for Analog LSI's," Proceedings of the 28th ACM/IEEE Design Automation Conference, pp. 510–513, 1991.

*Primary Examiner*—Kevin J. Teska
*Assistant Examiner*—Samuel Broda
*Attorney, Agent, or Firm*—Finnegan, Henderson, Farabow, Garrett & Dunner, L.L.P.

[57] ABSTRACT

In a wire length minimization apparatus for moving an object and a wire in a wiring pattern formed by connecting objects with wires, in accordance with a load representing a performance of wire length minimization considering a priority set for each wire, thereby minimizing a length of the wire, a tree having, as nodes, a plurality of objects having a predetermined positional relationship are formed, a load of a parent node with respect to a child node is calculated sequentially from a leaf of the tree based on a load of the child node, and an object and a wire corresponding to a tree portion having a root node with a load satisfying a predetermined condition is satisfied as an object to be moved. With this arrangement, movement of the objects and wires can be executed to efficiently and effectively reduce the cost of the wires.

36 Claims, 26 Drawing Sheets

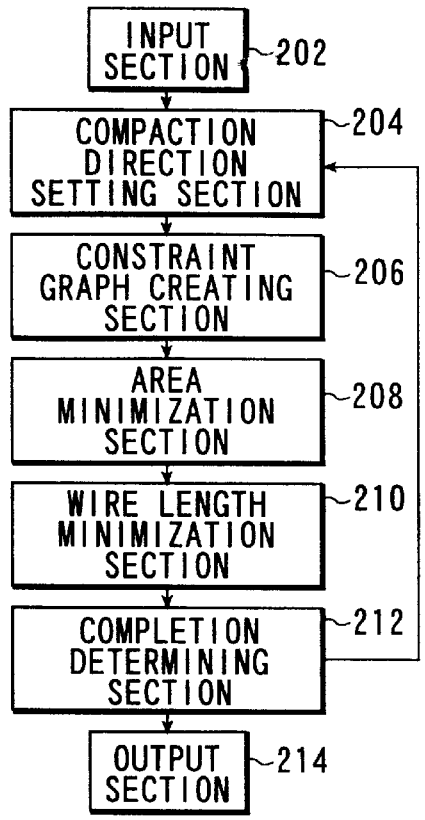
FIG. 1 PRIOR ART
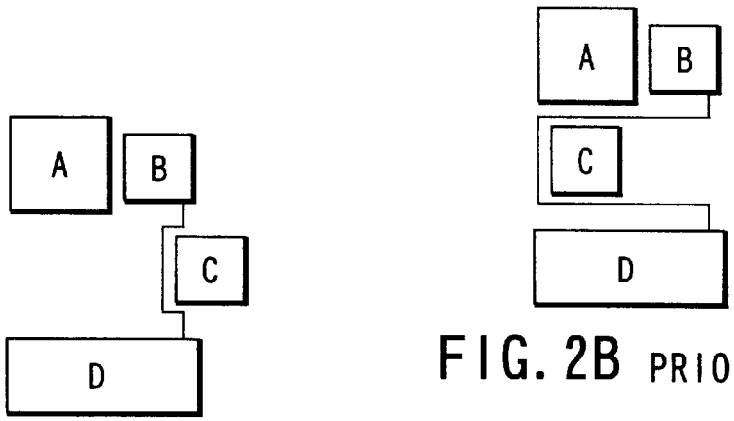
FIG. 2A PRIOR ART
FIG. 2B PRIOR ART
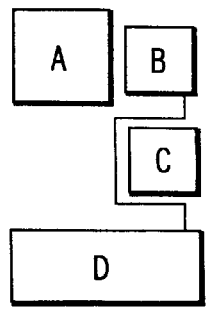
FIG. 2C PRIOR ART

| PATTERN ID | VERTEX ID | RELATIVE COORDINATE |
|---|---|---|
| 1 | j | $X_1 (=0)$ |
| 2-1 | j | $X_{2-1} (=d_2)$ |
| 2-2 | i | $X_{2-2} (=d_1)$ |
| 3 | i | $X_3$ |
| : | : | : |

WIRE LENGTH MINIMIZATION APPARATUS AND METHOD

BACKGROUND OF THE INVENTION

The present invention relates to a wire length minimization apparatus and method of performing total wire length minimization considering priority, which is performed next to area minimization processing in one-dimensional compaction of layout data of a semiconductor integrated circuit.

This application is based on Japanese Patent Application No. 9-201518, filed Jul. 28, 1997 and Japanese Patent Application No. 9-347851, filed Dec. 17, 1997, the content of which is incorporated herein by reference.

In designing a semiconductor integrated circuit represented by an IC, constituent elements (to be referred to as "objects" herein) such as semiconductor objects and wires are laid out in a limited area. To make a compact semiconductor integrated circuit and reduce the manufacturing cost in such design, it is important to minimize the layout area.

Processing of automatically minimizing the layout area by reducing the object interval is called compaction. The tool used for compaction is called a compactor. Note that an object means a group of layouts for simultaneous movement in the same certain direction by the same distance (or the layouts locally have a fixed relative positional relationship) in compaction.

In designing a large-scale IC layout, when the layout is roughly designed by a designer and then optimized using a compactor, the load on the designer can be reduced. When an advance in the manufacturing technique allows to change the design rule and reduce the initial object interval, the layout area can be automatically reduced by using the compactor. The compactor is used in various situations.

The wire length minimization problem to be described later is an important problem in this compaction processing.

From the viewpoint of a decrease in labor, the compactor is important in optimizing the large-scale layout. It is difficult to quickly and strictly optimize the two-dimensional wiring on the large-scale layout. However, although strict optimization is hardly done, it suffices that a compact layout capable of standing practical use can be quickly generated, and in many cases, compaction processing is sequentially performed in each direction (one-dimensional compaction).

FIG. 1 shows the arrangement of a conventional compactor for performing one-dimensional compaction. The horizontal direction of an IC layout will be referred to as the x direction, and the vertical direction as the y direction hereinafter for the descriptive convenience.

First, layout data is input from an input section 202.

A compaction direction setting section 204 sets the compaction direction to one of the X and y directions. Assume that compaction is performed in the x direction for the first and third times and in the y direction for the second and fourth times.

A constraint graph creating section 206 creates a constraint graph expressing the positional constraint relationship of objects for each compaction direction. The objects are made to correspond to the vertices (nodes) of the constraint graph, and the limit proximity distance between two objects corresponding to two vertices connected by a branch is stored in the constraint graph. After this, processing is performed with reference to this constraint graph.

An area minimization section 208 moves the objects to one side along the compaction direction as close as possible with reference to the constraint graph. For example, in compaction in the x direction, the objects are moved to the left side as close as possible. Assume that the area minimization section 208 moves the objects in a direction for decreasing the x-coordinate values of the vertices.

A wire length minimization section 210 moves the objects to minimize the wire length with reference to the constraint graph. The objects have already been moved in the direction for minimizing the x-coordinate values of the vertices by the area minimization section 208, so the objects cannot be moved anymore in the direction of decreasing the x-coordinate values of the vertices. Therefore, the wire length minimization section 210 performs only processing of increasing the x-coordinate values of the vertices.

A completion determining section 212 determines whether the completion condition is satisfied. If the completion condition is satisfied, processing is ended, and the result is output from an output section 214. If the completion condition is not satisfied, processing is transferred back to the compaction direction setting section 204, and the compaction processing is repeatedly performed while changing the compaction direction.

Processing in the area minimization section 208 and that in the wire length minimization section 210 will be described below. As described above, the area minimization section 208 moves the objects to one side along the compaction direction. As a result, when processing in the area minimization section 208 is complete, the wire length partially increases. Such an increase in wire length upon processing in the area minimization section 208 will be described with reference to FIGS. 2A to 2C.

To reduce a layout having four objects A to D as shown in FIG. 2A in the x direction, the area minimization section 208 moves the objects to the left side. As a result, the object C is moved to the left side, as shown in FIG. 2B. In FIG. 2C, the object C is close to the right, as compared to FIG. 2B, though the entire layout area does not change. That is, the object C need not always be fully moved to the left to minimize the area. Additionally, the layout in FIG. 2B is inferior to that in FIG. 2C in the following two points.

(1) The wire in FIG. 2B is too long, and the resistance is higher than that of the given layout.

(2) In FIG. 2B, in the next compaction in the y direction, the object A cannot be moved to the lower side because of the object C. For this reason, the finally output layout area becomes large.

Generally, in moving the objects to one side as close as possible to minimize the area, the area does not change in a certain range even when the objects are moved. As can be seen from comparison between FIG. 2B and FIG. 2C, minimization of the wire length often contributes to minimization of the entire area (e.g., reference 1"Y. E. Cho: A Subjective Review of Compaction, Proc. 22nd Design Automation Conference, 1985, pp. 396–404"). Therefore, the problem to be solved by processing of the wire length minimization section 210 is how to minimize the wire length within this allowable range.

This problem is called a wire length minimization problem, and it is an important problem in one-dimensional compaction.

More generally speaking, the wire length minimization problem can be defined as "a problem for minimizing the cost under the constraint condition". To realize more effective one-dimensional compaction, it is important to efficiently solve this problem. The wire length minimization problem will be described below.

The "cost" will be described first. Although processing in the x direction will be described below, this also applies to processing in the y direction.

In minimizing the total wire length, the whole length cannot be sufficiently shortened only by shortening the individual wires. In addition, if the wires have different priorities for minimization, these priorities cannot be taken into consideration. Therefore, a cost based on all wires is defined, and the individual objects are moved to reduce the cost.

Line segments of a straight wire and a polygonal wire will be referred to as lines. The wire length in the x direction can be obtained by calculating the sum of the lines in the x direction.

The wires have different priorities for minimization. For example, generally, a wire belonging to a mask layer with a high resistance is required to be preferentially shortened. In this case, the line length is multiplied by a predetermined priority to calculate the cost. Letting $x_i$ be the x-coordinate value of each inflection of a wire, and $c_{ij}$ be the priority, the cost is given by equation (1). Assume that a line having a large level of priority must be preferentially shortened. In this case, J is a set of combinations of suffixes corresponding to two ends of lines.

$$\text{cost} = \Sigma c_{ij} |x_i - x_j| \qquad (1)$$

$(i, j) \in J$

Elimination of the absolute value symbols of equation (1) and rearrangement of the result of elimination yields equation (2):

$$\text{cost} = \Sigma w_i \, x_j \qquad (2)$$

Equations (1) and (2) are equivalent within the range where the magnitude relationship between the x-coordinate values of the two ends of the line does not reverse.

In equation (2), the cost can be reduced by decreasing the x-coordinate value $x_i$ when a coefficient $w_i$ is a positive value or by increasing the x-coordinate value $x_i$ when the coefficient $w_i$ is a negative value. Since equations (1) and (2) must be equivalent, this operation must be performed without replacing the left and right of the line with each other. To minimize equation (1), the left and right of the line must be replaced with each other. However, once the left and right of a line are replaced with each other, equation (2) must be corrected.

When the line having a length of 0 is inverted at an appropriate timing to rewrite the cost of equation (2), the cost of equation (1) can be minimized.

The above-described "constraint condition" will be described next.

Assume that $x_i$ represents the x-coordinate value of a side of a polygon representing an object including the inflection of a wire, unless otherwise specified. The design rule is a condition defined by the manufacturing process and also a constraint condition associated with the positional relationship between objects. This condition can be generally represented as follows.

$$x_i - x_j \geq d_{ij} \qquad (3)$$

This x-coordinate value $x_i$ and a vertex of the constraint graph are made to correspond to each other, thereby expressing equation (3) as a constraint graph shown in FIG. 3.

In the constraint graph, the coordinate value $X(v)$ is stored in a vertex v, and a constraint condition value $D(e)$ is stored in a branch e. The branch in FIG. 3 represents $$X(v_q) - X(v_p) \geq D(e_{pq}) \qquad (4)$$

Generally, the coordinate value $x_i$ of the end point of line and the coordinate value $X(v_p)$ of a vertex corresponding to the end point hold a relation $x_i = X(v_p) + c_i$ ($c_i$ is a constant) therebetween. Therefore, by eliminating the constant term, the cost is given by:

$$\text{cost} = \sum_p w(v_p) x(v_p) \qquad (5)$$

FIG. 4 shows an example of a general constraint graph. Since a sink corresponding to the right end point of the layout and a source corresponding to the left end point are added, the constraint graph is a connected graph.

The wire length minimization problem is a problem for minimizing the cost of equation (1) within a range where the constraint condition represented by the constraint graph is satisfied.

A local improvement method and a group improvement method as conventional wire length minimization methods will be described below.

To reduce the cost, when a weight $W(v_p)$ of a vertex $v_p$ is positive, the vertex position is decreased, and when the weight of the vertex is negative, the vertex position is increased. Before one-dimensional minimization processing, area minimization processing is performed to make the coordinate values of each vertex as small as possible. Therefore, the wire length minimization section cannot further decrease the coordinate value of each vertex. For this reason, as described above, the wire length minimization section only need to perform processing of increasing the coordinate values of each vertex.

When the weight of each vertex is negative, the cost can be considerably reduced by increasing the coordinate values of each vertex within the range not violating the constraint condition. This method is called the local improvement method.

However, only with the local improvement method, the cost converges to a solution far from the optimum solution, as is known. In an example shown in FIG. 5, the wire lengths cannot be sufficiently minimized by the local improvement method. Bullets near the wires mean that objects on both sides cannot come close to each other anymore.

In the example of FIG. 5, however, when a plurality of objects are simultaneously moved, an arrangement with a lower cost can be obtained. Consider the group of objects A to H in FIG. 5. A wire length with priority 4 is connected to this object group from the right side while a wire with priority 1 and a wire with priority 2 are connected to this object group from the left side. When all the objects are simultaneously moved to the right side, the wire with priority 1 and the wire with priority 2 extend. However, the wire with priority 4 is shortened, and the cost is reduced. Even when the three hatched objects B, D, and E are simultaneously moved, the cost can be reduced.

The method of simultaneously moving a plurality of vertexes in one group is called the group improvement method. Whether the cost can be reduced by moving the entire group to the right side can be determined by calculating the sum of weights of all vertexes in the group. As in the local improvement method, when the sum value is negative, the cost can be reduced by moving the group to the right side.

In the group improvement method, processing can be efficiently executed by storing, in a tree, vertexes to be simultaneously moved in a group. The tree has branches of a tight constraint graph, which direct from parents to children. The group of vertexes to be simultaneously moved changes over time during processing. Therefore, every time the group is moved, the members of the tree must be corrected.

In FIG. 5, the cost can be sufficiently reduced by moving not all objects but the three hatched objects B, D, and E to the right. In this state, the optimum operation is movement of the three objects B, D, and E. The problem is how to efficiently obtain a tree having the three objects B, D and E as members.

In a conventional method (e.g., reference 2 "W. L. Schiele: Improved Compaction by Minimized Length of Wires, Proc. 20th Design Automation Conf., 1983, pp. 121–127", reference 3 "G. Lakhani, R, Varadarajan: A Wire-Length Minimization Algorithm for Circuit Layout Compaction, IEEE International Symposium on Circuits and Systems, Vol. 1, pp. 276 –279", or reference 4 "C. Kingsley: A Hierarchical, Error-Tolerant Compactor, IEEE 21st Design Automation Conf., 1984, pp. 126–132"), the sum of weights of vertexes on routes from the root of the tree to the vertexes is obtained as an accumulated value. If the accumulated value of a certain leaf is positive, the vertexes on this route are fixed, and the remaining vertexes are separated and moved. This method will be described with reference to FIGS. 6A and 6B.

In FIG. 6A, a numerical value in a circle representing a vertex is the wight of the vertex, and a numerical value in parentheses near each vertex represents the accumulated value of the weights on the route. A weight is the desired degree of movement of the vertex to the left, and a vertex having a negative accumulated value is a candidate to be moved to the right. A vertex without the negative accumulated value is not moved. According to the conventional method, vertexes $v_{301}$ to $v_{303}$ on the lowest route must be fixed. These vertexes are separated, as shown in FIG. 6B. Next, in the remaining partial trees, vertexes having a negative sum value are searched for. As a result, two vertexes $v_{304}$ and $v_{305}$ enclosed by a broken line in FIG. 6B are moved to the right side.

In the layout shown in FIG. 5, however, the three hatched objects B, D, and E cannot be satisfactorily moved by employing this method.

FIG. 7 shows a tree in which accumulated values are calculated for groups corresponding to FIG. 5. As is apparent from FIG. 7, since all the leaves have negative accumulated values, this tree cannot be decomposed to separate the objects B, D, and E. That is, a tree having, as members, the three hatched objects B, D, and E in the layout shown in FIG. 5 cannot be obtained by the conventional group improvement method.

In addition to the above-described methods, methods of executing linear programming scheme on a graph to obtain an optimum solution (reference 5"J. Lee, C. K. Wong: A Performance-Aimed Cell Compactor with Automatic Jogs, IEEE Trans. Computer-Aided Design, Vol. 11, No. 12, 1992, pp. 1495–1507, 1992", and reference 6 "T. Yoshimura: A Graph Theoretical Compaction Algorithm, IEEE Proc. ISCA 85, 1985,pp. 1455–1458") have also been proposed. However, in these methods, the processing speed is low.

As described above, in the conventional one-dimensional compaction processing, when the group improvement method is used in wire length minimization processing next to area minimization processing, object movement for cost reduction of the wires is allowed. However, the objects which can be moved cannot be specified, so that such objects cannot be moved and the sufficient compaction cannot be performed. When linear programming scheme is used for wire length minimization processing, the processing requires a long time.

BRIEF SUMMARY OF THE INVENTION

The present invention has been made in consideration of the above situation, and has as its object to efficiently specify objects to be moved for cost reduction of wires in a wire length minimization apparatus and method of performing wire length minimization which is performed next to area minimization processing in one-dimensional compaction processing for the layout of a semiconductor integrated circuit.

It is another object of the present invention to effectively minimize the wire length by using a variety of combinations of vertexes to be moved for wire length minimization in a constraint graph, as compared to the prior art.

It is still another object of the present invention to provide a wire length minimization technique with good convergence properties.

It is still another object of the present invention to effectively minimize the total wire length while avoiding an excess change in layout.

According to the present invention, there is provided a wire length minimization method of moving an object and a wire in a wiring pattern formed by connecting objects with wires, in accordance with a load representing a performance of wire length minimization considering a priority of each wire, thereby minimizing a wire length, the method comprising the following steps of:

forming a tree having, as nodes, a plurality of objects having a predetermined positional relationship;

calculating, sequentially from a leaf side of the tree, a load of a parent node based on a load of a child node; and specifying objects and wires corresponding to a tree portion having a root node with a load satisfying a predetermined condition, and moving the specified objects and wires as a whole.

The predetermined positional relationship defines that two objects are positioned at a limit proximity distance.

One of the two objects in the tree portion, which is positioned on an root side is defined as the parent node while the other positioned on a leaf side is defined as the child node, and a load of each leaf node, having no child nodes, is obtained as a weight value which is calculated by subtracting a sum of minimization priorities of line segments each having one end at the node and shortened upon moving the node for a predetermined direction from a sum of minimization priorities of line segments each having one end at the node and extending upon moving the node for a predetermined direction.

The load of the node having child nodes is obtained by adding all positive loads of the child nodes of the node to the weight value of the node.

The predetermined condition to be satisfied by the load is that the load has a negative value.

The above method is repeatedly executed until a completion condition including one or a predetermined combination of conditions is satisfied, the conditions including a condition that all objects and wires are not moved for two cycles even when the method is executed, a condition that all objects and wires are not moved even when the method is executed, a condition that a repetition count exceeds a predetermined count, and a condition that a change in cost, which corresponds to a sum value of weighted line segment lengths of wires, is smaller than a predetermined value.

The specifying and moving step comprises substeps of:

representing a relationship between two ends of a wire line segment in a constraint graph; and moving the objects and the wires within a range not inverting a positional relationship between two ends of the wire line segment.

The specifying and moving step comprises substeps of:

moving the objects and the wires within a range not inverting a positional relationship between two ends of a wire line segment; and if a wire line segment has a length of 0 upon completion of movement of the objects and wires, inverting the positional relationship between the two ends of the wire line segment, correcting a structure of the tree, and re-calculating the load.

The specifying and moving step comprises substeps of:

moving the objects and the wires within a range not inverting a positional relationship between two ends of a wire line segment; and if some wire line segments have a length of 0 when the completion condition is satisfied, then inverting their positional relationships between two ends of the wire line segments and repeatedly executing the moving step until the completion condition is satisfied again.

The specifying and moving step comprises substeps of:

moving the objects and the wires within a range not inverting a positional relationship between two ends of a wire line segment; and if some wire line segments have a length of 0 or some branches between vertexes corresponding to two ends of wire line segments become tight when the completion condition is satisfied, then merging two ends of their wire segments and repeatedly executing the moving step until the completion condition is satisfied again.

A portion where a layout of the objects and the wires is changed is specified, and a convergence state is presented in a form displaying a difference between the layout before change and that after change or a form displaying at least one of a value of a difference of total wire length and that of the cost, and a repetition count input by a user is used as the completion condition.

The minimization priority of each wire line segment is represented as a function of a length of the wire line segment, a width of the wire line segment, and a mask layer to which the wire line segment belongs.

A specific design rule and the priority of each wire can be set for only a specific portion of the wiring pattern.

According to the present invention, there is provided a wire length minimization apparatus for moving an object and a wire in a wiring pattern formed by connecting objects with wires, in accordance with a load representing a performance of wire length minimization considering a priority of each wire, thereby minimizing a wire length, the apparatus comprising:

means for forming a tree having, as nodes, a plurality of objects having a predetermined positional relationship;

means for calculating, sequentially from a leaf side of the tree, a load of a parent node based on a load of a child node; and means for specifying objects and wires corresponding to a tree portion having a root node with a load satisfying a predetermined condition, and moving the specified objects and wires as a whole.

According to the present invention, there is provided a computer readable storage medium which stores a wire length minimization program for moving an object and a wire in a wiring pattern formed by connecting objects with wires, in accordance with a load representing a performance of wire length minimization considering a priority of each wire, thereby minimizing a wire length, the program comprising:

computer readable program code means for forming a tree having, as nodes, a plurality of objects having a predetermined positional relationship;

computer readable program code means for calculating, sequentially from a leaf side of the tree, a load of a parent node based on a load of a child node; and computer readable program code means for specifying objects and wires corresponding to a tree portion having a root node with a load satisfying a predetermined condition, and moving the specified objects and wires as a whole.

According to the present invention, there is provided another wire length minimization method of minimizing a length of a wire connecting objects included in a given layout, the method comprising the following steps of:

moving vertexes representing the objects or wires to minimize a wire length in a constraint graph representing an arrangement of the objects and wires in the layout and a constraint condition associated with the arrangement;

forming a tree which contains vertexes which should move simultaneously; and adding a virtual vertex having the plurality of vertexes as children when a plurality of vertexes can have the same vertex as a child, thereby generating a tree including the plurality of vertexes as a tree to be moved.

The moving step comprises a substep of calculating a wire length minimization effect generated by moving each object and wire in a specific direction, based on a priority set for each wire in advance.

When a more excellent wire length minimization effect is obtained by moving a tree having, as a root, the virtual vertex to be added than by moving a tree having, as a root, one of the plurality of vertexes, the adding step adds the virtual vertex.

The above method further comprising step of adding, to the constraint graph, a first auxiliary vertex corresponding to one of two end points of a line representing one of wires, which has a larger coordinate value, and a second auxiliary vertex corresponding to the other end point which has a smaller coordinate value.

According to the present invention, there is provided another wire length minimization method comprising the following steps of:

canceling a violation to a constraint condition included in a given layout; and adding a constraint condition for limiting a variation in a length of a line included in wires of the layout.

The constraint condition for limiting the variation of a line length, as an upper limit value of the line length, which is defined by a line length after the violation is canceled or which is obtained by converting the line length using a value set for each lines or for each set of lines.

The adding step comprises step of determining, in units of lines or in units of sets of lines, whether the constraint condition for limiting the variation in the line length is to be added.

Each set of lines is constituted by lines belonging to one of a plurality of layers included in the layout.

According to the present invention, there is provided another wire length minimization apparatus for minimizing a length of a wire connecting objects included in a given layout, the apparatus comprising:

means for moving vertexes representing the objects or wires to minimize a wire length in a constraint graph representing an arrangement of the objects and wires in the layout and a constraint condition associated with the arrangement;

means for forming a tree which contains vertexes which should move simultaneously; and means for adding a virtual vertex having the plurality of vertexes as children when a plurality of vertexes can have the same vertex as a child, thereby generating a tree including the plurality of vertexes as a tree to be moved.

According to the present invention, there is provided a still another wire length minimization apparatus comprising:

means for canceling a violation to a constraint condition included in a given layout; and means for adding a constraint condition for limiting a variation in a length of a line included in wires of the layout.

According to the present invention, there is provided a computer readable storage medium which stores a wire length minimization program for minimizing a length of a wire connecting objects included in a given layout, the program comprising:

computer readable program code means for moving vertexes representing the objects or wires to minimize a wire length in a constraint graph representing an arrangement of the objects and wires in the layout and a constraint condition associated with the arrangement;

computer readable program code means for forming a tree which contains vertexes which should move simultaneously; and computer readable program code means for adding a virtual vertex having the plurality of vertexes as children when a plurality of vertexes can have the same vertex as a child, thereby generating a tree including the plurality of vertexes as a tree to be moved.

According to the present invention, there is provided a computer readable storage medium which stores a wire length minimization program, the program comprising:

computer readable program code means for canceling a violation to a constraint condition included in a given layout; and computer readable program code means for adding a constraint condition for limiting a variation in a length of a line included in wires of the layout.

According to the present invention, a tree having, as nodes, a plurality of objects having a predetermined relationship is formed, and the load of each node is sequentially obtained from the leaves of the tree to the root while reflecting the load of the leaves. A group of objects to be moved can be easily obtained based on the loads, and movement of the objects can be executed to efficiently and effectively reduce the cost of the wires.

According to the present invention, when movement of a certain vertex requires simultaneous movement of another vertex because of an interval constraint between objects in the group improvement method, these vertexes can be put into a tree and simultaneously moved.

In the present invention, even a plurality of vertexes which cannot be stored in one tree in the current constraint graph structure because of the positional relationship can be simultaneously moved as a tree by adding a virtual vertex as a common root. For this reason, a variety of combinations of movable vertexes can be obtained, as compared to the prior art, and the wire length can be more effectively minimized.

In the present invention, since the wire length minimization effect by movement of a vertex or tree is calculated based on the priority of each wire, an important wire can be effectively shortened. As far as a wire with high priority can be shortened, the wire length minimization effect can be enhanced as a whole even when a wire with relatively low priority slightly extends.

In the present invention, even when a plurality of vertexes can have the same vertex as child nodes, a virtual vertex is added only when an excellent minimization effect can be obtained. Therefore, the wire length can be more effectively minimized.

In the present invention, in processing of sequentially moving the vertexes, even when the magnitude relationship between the coordinate values at the two ends of a wire is inverted, the magnitude relationship between the coordinate values of each auxiliary vertex does not change. In calculating the wire length minimization effect as a load or cost from the priority of each wire, when the calculation is performed based on the positional relationship of each auxiliary vertex, the positive and negative signs used in calculation do not change, so the equation need not be rewritten. As a result, the efficiency of processing increases and processing allows quick convergence to an optimum arrangement.

In the present invention, the variation in line length is limited by a constraint condition based on the line length in the absence of constraint violation. Therefore, an excess change in layout is prevented, and a high-quality layout can be obtained.

In the present invention, as the upper limit value of the line length, the line length after the violation is canceled can be used. In addition, the allowable increase range or ratio can be used, and processing corresponding to the nature of the layout is allowed.

In the present invention, lines for which constraint conditions are to be set can be finely determined for each lines or sets of lines. By limiting the variation in line length mainly for an actually necessary portion, a high-quality layout can be obtained.

In the present invention, when the layout of a semiconductor object includes a plurality of layers, processing according to the characteristic feature of each layer can be performed such that, e.g., the variation in line length is limited for a high-resistance layer. Therefore, a high-quality layout can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 1 is a block diagram showing the arrangement of a conventional compactor;

FIGS. 2A, 2B, and 2C are views for explaining area minimization processing;

DETAILED DESCRIPTION OF THE INVENTION

A preferred embodiment of a wire length minimization apparatus and method of the present invention will be described below with reference to the accompanying drawings.

First Embodiment

In the first embodiment, the wire length is minimized using the above-described group improvement method, and the tree construction method is improved to find a group of vertexes to be effectively simultaneously moved.

Figure 8:
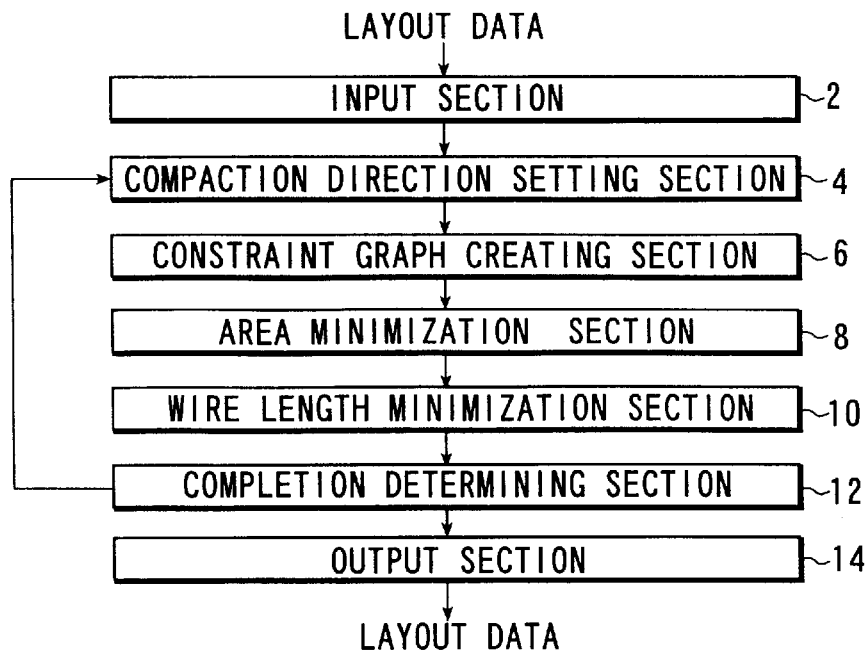
FIG. 8 is a block diagram showing a compactor including a wire length minimization section according to the first embodiment of the present invention.
Figure 9:
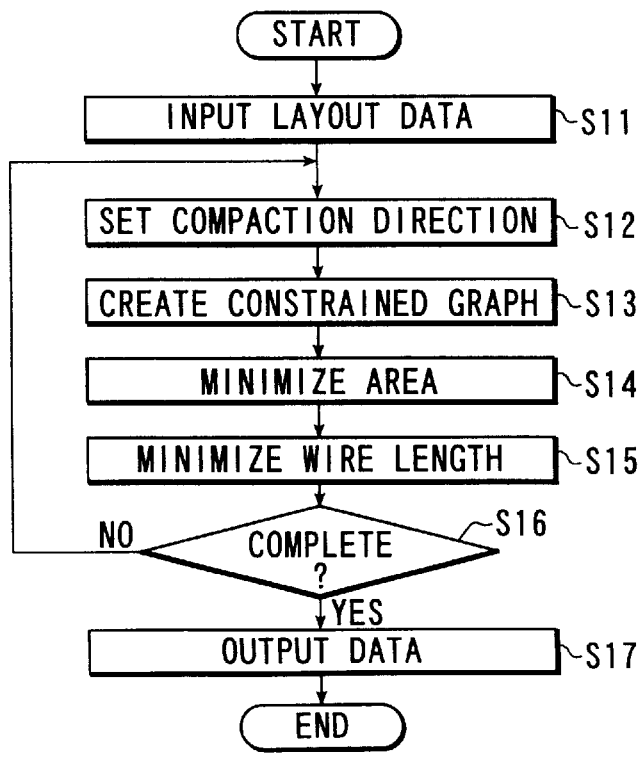
FIG. 9 is a flow chart showing the procedure of compaction processing in the first embodiment of the present invention.
Figure 10:
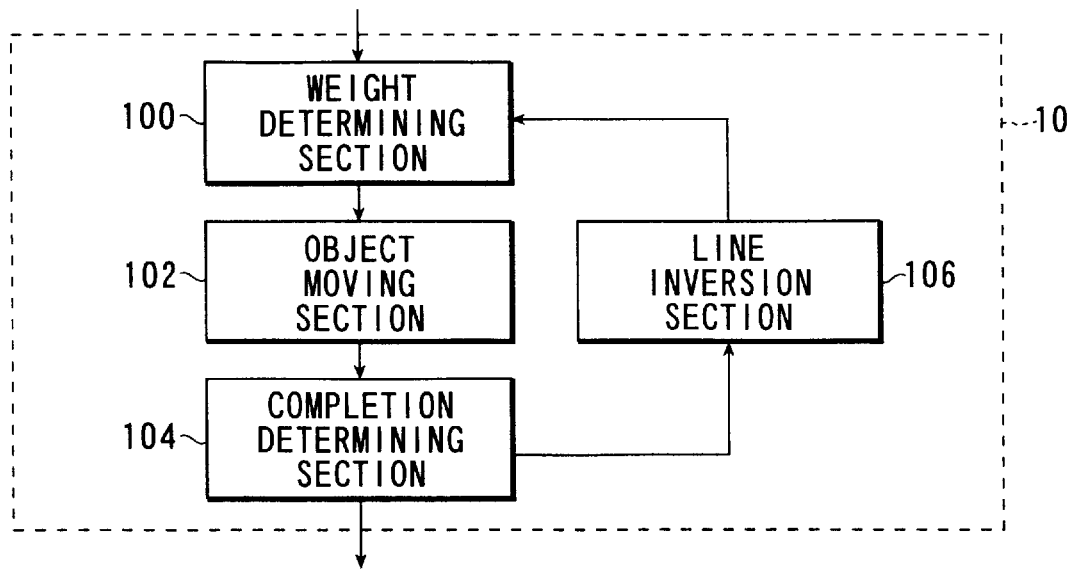
FIG. 10 is a block diagram showing the arrangement of the wire length minimization section shown in FIG. 8.
Figure 11:
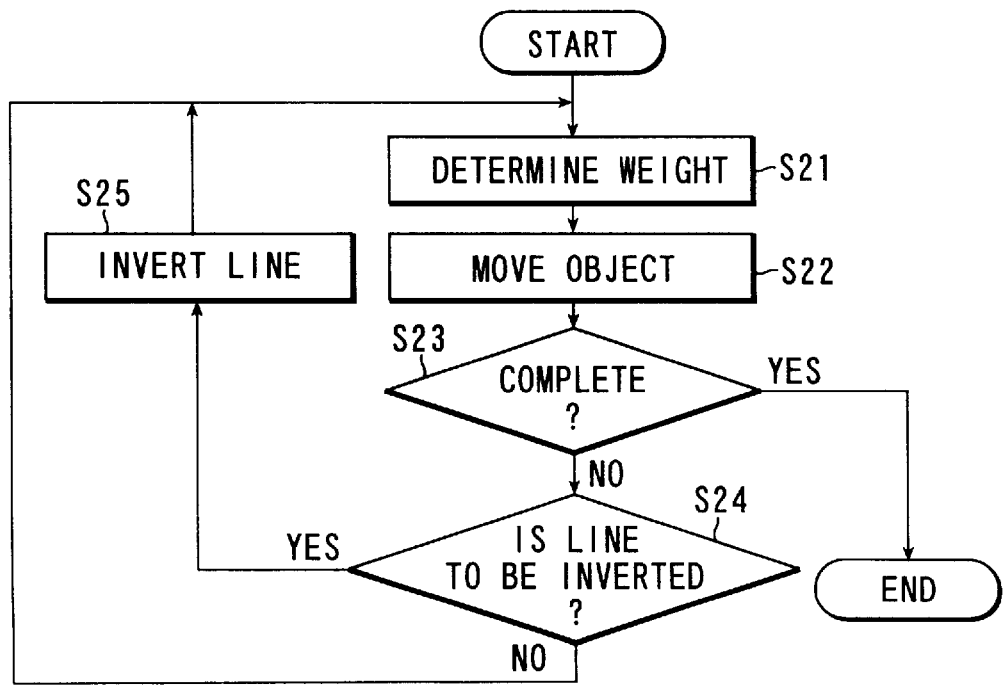
FIG. 11 is a flow chart showing the procedure of processing of the wire length minimization section shown in FIG. 10.
Figure 12:
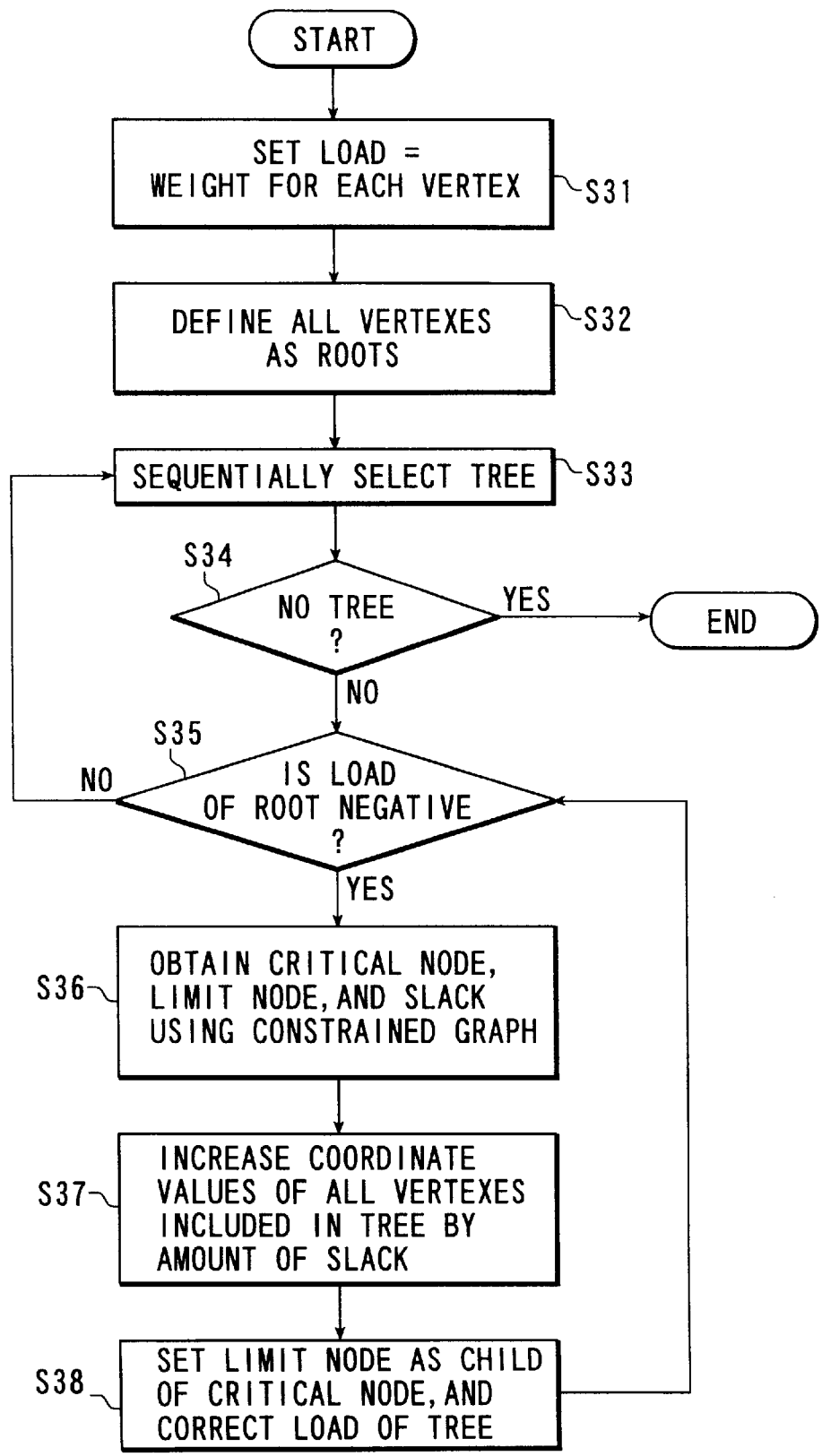
FIG. 12 is a flow chart showing the procedure of weight determination processing and object movement processing of the wire length minimization section shown in FIG. 10.

FIG. 8 shows the arrangement of a compactor including a wire length minimization apparatus according to the first embodiment of the present invention. FIG. 9 shows the processing procedure of this compactor. FIG. 10 shows the internal arrangement of a wire length minimization section 10 of the compactor shown in FIG. 8. FIG. 11 shows the processing procedure of the wire length minimization section 10 shown in FIG. 10. FIG. 12 shows the procedure of weight determination processing and object movement processing of the wire length minimization section shown in FIG. 10.

As shown in FIG. 8, the compactor of this embodiment comprises an input section 2, a compaction direction setting section 4, a constraint graph creating section 6, an area minimization section 8, the wire length minimization section 10, a completion determining section 12, and an output section 14. This compactor can be constituted not as hardware but by a computer and a program (or a computer, an operating system, and a program).

For the descriptive convenience, the horizontal direction of an IC layout will be referred to as the x direction, and the vertical direction as the y direction hereinafter. In a description of a specific example, objects are moved to the left side first, and then they are moved to the right side to reduce the cost.

The input section 2 inputs the layout data of an IC to be processed (step S11 in FIG. 9).

The layout data includes the coordinate values (e.g., the coordinate values of two diagonal points of a rectangle representing an object) of each pattern of each mask layer.

The input section 2 also inputs design rule data. A design rule database may be arranged. The identification information of a design rule may be input from an external device through the input section 2, and corresponding design rule data may be retrieved from the design rule database using the identification information as a key.

The priority of each wire depends on the attribute of the wire (e.g., the mask layer). The priority data of each wire (data representing, e.g., the correspondence between the attribute and the priority of the wire) is input from the input section 2. Alternatively, a database is prepared, and identification information input from an external device through the input section 2 is used as a key to retrieve corresponding data from the database.

The priority may be set in units of lines. For example, the priority of a line may be obtained as the function of the line length, the line width, and the mask layer where the line is to be formed. In this function, as the value defined for the mask layer increases, the function value becomes large. As the line length becomes large, the function value becomes large. As the line width increases, the function value becomes small. Alternatively, selection of this function may be allowed.

A specific design rule and the priority of each line may be set for a limited specific portion of the layout.

The compaction direction setting section 4 sets the compaction direction to one of the X and y directions (step S12 in FIG. 9). For example, compaction is performed in the x direction for the first time, and in the y direction for the second time. When this set of compaction operations is to be performed twice, compaction direction is sequentially set to the x direction, the y direction, the x direction, and the y direction.

The constraint graph creating section 6 creates a constraint graph for the compaction direction with reference to the layout data and the design rule data (step S13 in FIG. 9).

Figure 17:
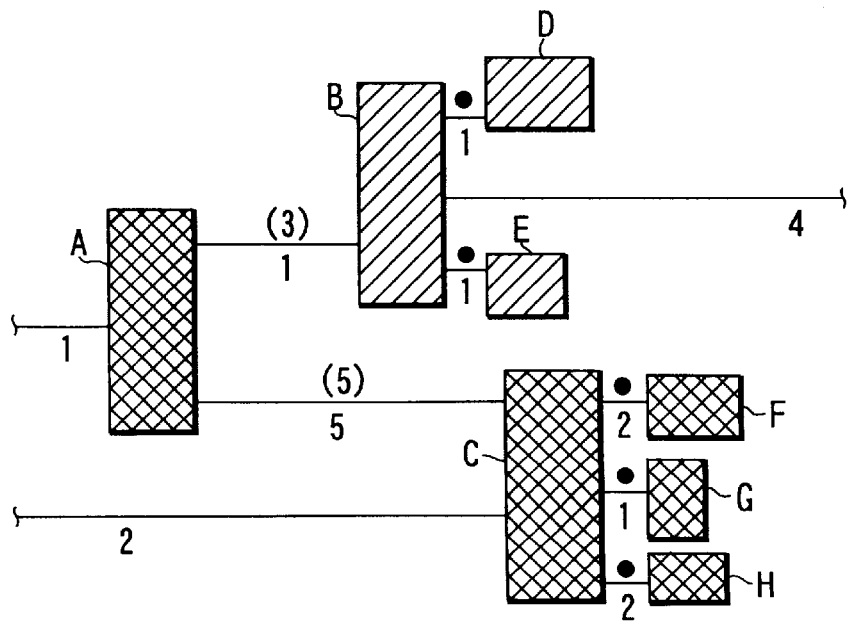
FIG. 17 shows an object arrangement.
Figure 21:
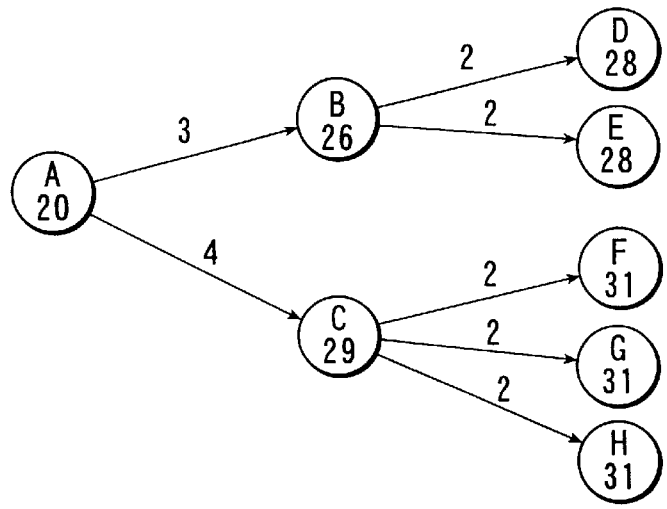
FIG. 21 shows a constraint graph corresponding to the state shown in FIG. 17.

For example, a constraint graph as shown in FIG. 21 is created for a layout including eight objects A to H as shown in FIG. 17. Referring to FIG. 21, each circle representing a vertex has a corresponding one of the pieces of identification information A to H of the object and the coordinate value of the vertex. In addition, a minimum necessary interval (to be referred to as a limit proximity distance) between vertexes is added to a branch connecting the vertexes.

In FIG. 17, the priority of each wire is shown. In addition, when the allowable proximity distance (called a slack) representing the margin of proximity between two objects corresponding two vertexes is larger than 0, the value of the slack is put in parentheses and added to each wire in FIG. 17. A slack of 0 is indicated as a bullet on the wire in FIG. 17. A branch having a slack of 0 in the constraint graph will be called a tight branch.

A branch in the constraint graph gives a constraint positional relationship between objects and does not always correspond to a wire. Objects corresponding two vertexes at the two end points of a branch are not sometimes connected by a wire.

The relationship between object patterns, objects, and the vertexes (nodes) of the constraint graph will be described.

Figures 13, 14:
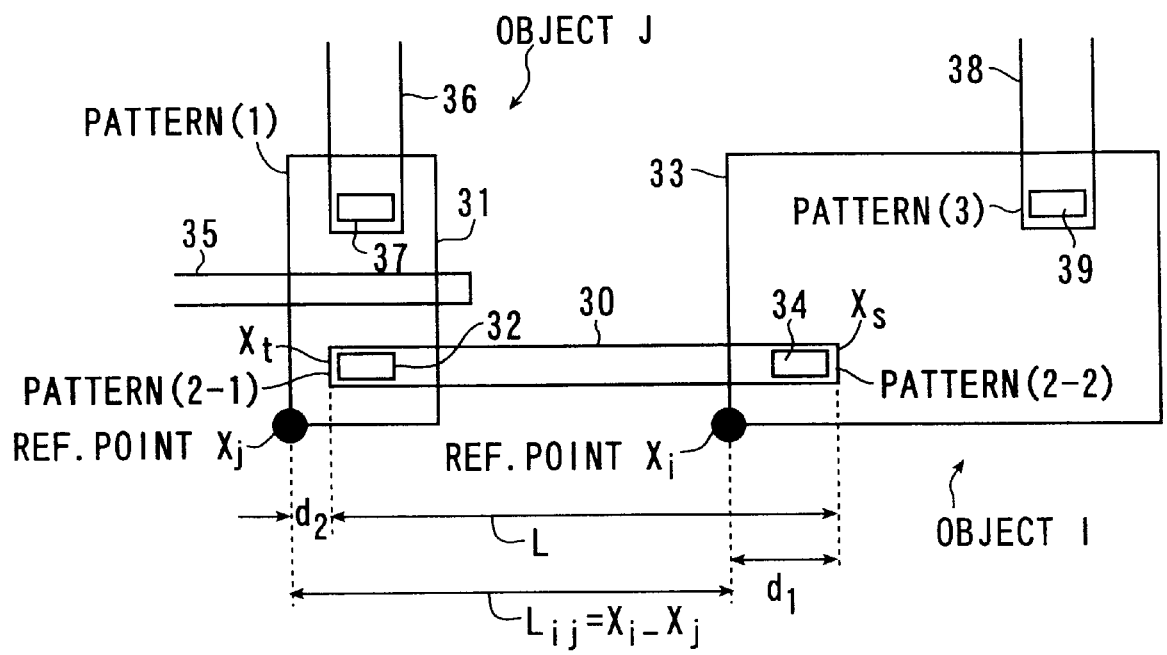
FIG. 13 shows a layout pattern.
FIG. 14 is a table storing the correlation between patterns, vertexes, and the relative coordinates.

FIG. 13 shows an example of (part of) an IC layout for explaining the relationship. As described above, compaction is to be performed in the x direction. Referring to FIG. 13, reference numeral 30 denotes a wiring pattern to be processed; 31 and 33, diffusion layer patterns; 36 and 38, other wiring patterns; 32, 37, 34, and 39, contact hole patterns; and 35, another wiring pattern connected to the diffusion layer 31. In FIG. 13, the patterns 31, 32, 36, and 37, the left-side end portion of the wire 30, and the right-side end portion of the wire 35 are put into a pattern group or an object group to be simultaneously moved, and this group forms one object J. Similarly, the patterns 33, 34, 38, and 39, and the right-side end portion of the wire 30 are put into a pattern group or an object group to be simultaneously moved, and this group forms another object I.

The constraint graph has a connection from a vertex (vertex $v_j$) corresponding to the object J to a vertex (vertex $v_i$) corresponding to the object I. When the reference point of the object J is set at an x-coordinate $X_j$ of the lower left corner of the pattern 31, and the reference point of the object I is set at an x-coordinate $x_i$ of the lower left corner of the pattern 33, $X_j$ is stored as the coordinate value of the vertex $v_j$, and $X_i$ is stored as the coordinate value of the vertex $v_i$. The value (limit proximity distance) of the constraint condition given between the two objects, i.e., the vertexes is defined by one of the design rules corresponding to the two objects, which minimizes the limit proximity distance. The limit proximity distance is stored in correspondence with the branch connecting the two vertexes corresponding to each other.

Movement of objects in area minimization processing or wire length minimization processing is performed by moving the coordinates of the vertex of the constraint graph, i.e., the coordinates of the reference point of the object I. In one object, the relative positional relationship between the reference point of the object and each pattern is always fixed. Therefore, as shown in FIG. 14, the identification information of a vertex corresponding to an object to which a pattern belongs, and the relative coordinate from the coordinates of the vertex (reference point of the object) are stored. When the coordinates of the vertex are moved, the coordinates of each pattern can be obtained from the table as shown in FIG. 14 and the constraint graph.

For example, letting $x_t$ be the x-coordinate value of the left-side end portion of the wiring pattern 30 and $d_2$ be the relative coordinate from the coordinate $X_j$ of the corresponding vertex $v_j$, $x_t$ is given by $x_t = X_j + d_2$. Similarly, letting $x_s$ be the x-coordinate value of the right-side end portion of the wiring pattern 30 and $d_1$ be the relative coordinate from the coordinate $X_i$ of the corresponding vertex $v_i$, $x_s$ is given by $x_s = X_i + d_1$.

Letting L be the length of the wiring pattern 30 in the x direction, L is given by $$L = x_s - x_t$$
$$= (X_i + d_1) - (X_j + d_2)$$
$$= (X_i - X_j) + (d_1 - d_2)$$
$$= L_{ij} + \text{constant}$$

As described above, L is obtained by adding an offset difference $(d_1 - d_2)$ to the distance $L_{ij}$ between the reference point of the object I to which the right-side end portion of the wiring pattern 30 belongs and the reference point of the object J to which the left-side end portion belongs. That is, the length L of the wiring pattern 30 in the x direction is uniquely determined by the distance $L_{ij}$ between the reference point of the object I and that of the object J. Therefore, as described above, the cost is represented by equation (5) by eliminating the constant term. In evaluating the cost using equation (1), the length of each wire must be obtained. However, when equation (5) is used, the cost can be calculated using only the vertex coordinates.

Movement of the objects in area minimization processing, movement of the objects in wire length minimization processing, or calculation/evaluation of the cost can be performed by processing the reference points of objects, i.e., the vertex coordinates of the constraint graph or the constraint condition between the vertex coordinates. Coordinates after movement of each pattern are obtained finally.

Figure 15:
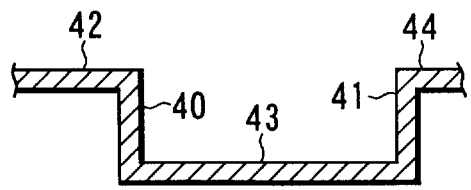
FIG. 15 shows another layout pattern.

As shown in FIG. 15 showing a wire with bent portions, a wire line segment itself sometimes forms one object, like a y-direction wire line segment 40 in x-direction compaction or an x-direction wire line segment 43 in y-direction compaction. In FIG. 15, consider y-direction compaction. Each of x-direction wire line segments 42, 43, and 44 forms an object. In this case, the wire line segment 43 is moved to the upper side such that the y-coordinate value of the wire line segment 43 does not exceed the y-coordinate values of the wire line segments 42 and 44 (that is, limit proximity distance=0). To allow movement such that the y-coordinate value of the wire line segment 43 exceeds the y-coordinate values of the wire line segments 42 and 44, line inversion processing to be described later is performed. To simultaneously move the wire line segments 42, 43, and 44 to the upper side, merge processing to be described later is performed.

The area minimization section 8 performs processing of moving the objects to one side of the compaction direction as close as possible with reference to the constraint graph (step S14 in FIG. 9). For example, in x-direction compaction, the objects are moved to the left side as close as possible. In the following description, assume that the objects are moved in a direction of minimizing the vertex coordinates (left side in x-direction compaction and lower side in y-direction compaction).

Actually, the vertex coordinates are made as small as possible with reference to the constraint graph, and at the same time, the coordinate values of moved vertexes in the constraint graph are updated.

Next, the wire length minimization section 10 generates a tree to be described later and also moves the objects to minimize the wire lengths (more specifically, minimize the cost) while referring to and updating the constraint graph (step S15 in FIG. 9). The objects have already been moved in the direction for minimizing the vertex coordinates by the area minimization section 8, and cannot be moved anymore to further decrease the vertex coordinates. Therefore, the wire length minimization section 10 performs only processing of increasing the vertex coordinates.

In this embodiment, in place of the "accumulated value" in the conventional group improvement method, the "load" of each vertex is obtained, and an optimum vertex group is obtained based on the load. The "load" to be used in this embodiment will be described with reference to FIG. 16.

Figure 7:
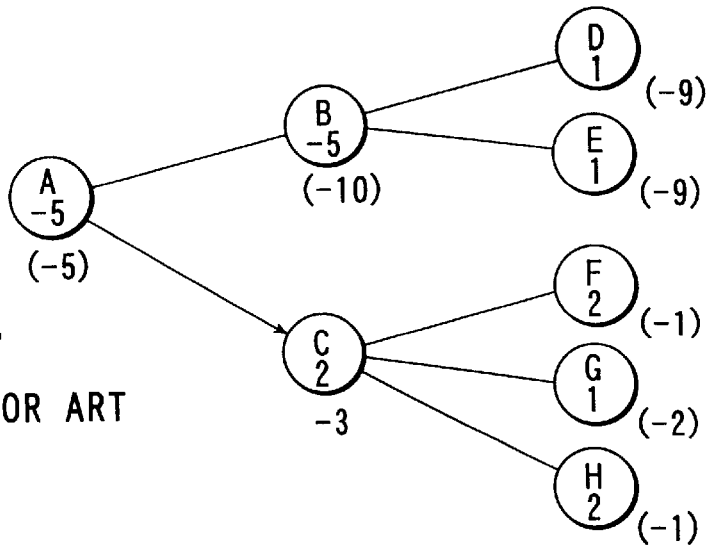
FIG. 7 shows another tree so as to explain the accumulated value.
Figure 16:
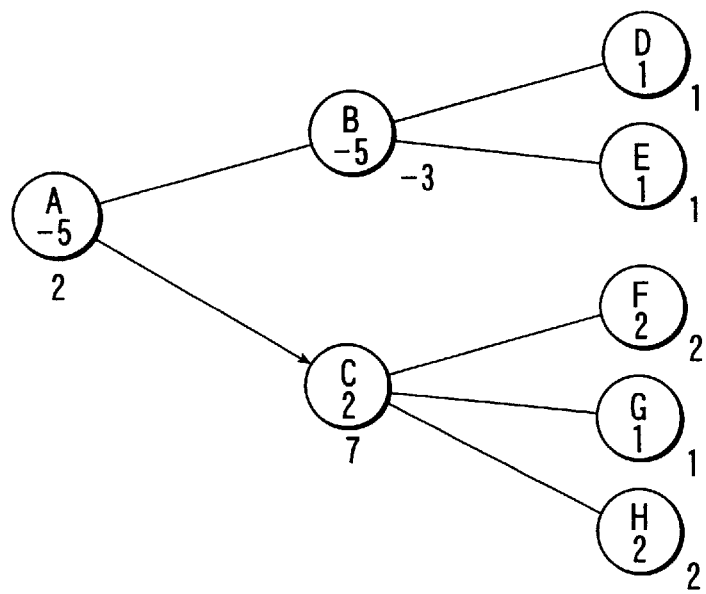
FIG. 16 shows a tree so as to explain the concept of a load.

FIG. 16 shows a tree generated in the present invention to obtain the group of vertexes to be simultaneously moved in the group improvement method. FIG. 16 corresponds to the layout of the prior art shown in FIG. 5 and FIG. 18 corresponds to the tree of the prior art shown in FIG. 7. In FIG. 16, a circle representing a vertex has the identification information of a corresponding object and the weight of the vertex. The weight means a weight $W(v_p)$ of equation (5). For example, the object A includes the right-side end portion of a wire with priority 1, and the left-end portions of two wires with priority 1 and priority 5, so the weight of the object A is +1−1−5=−5.

To obtain a load R(v) of a vertex v, calculation is sequentially performed from a vertex (leaf node) as a leaf to a root. In this case, S(v) is the set of children of the vertex v. In addition, θ(x) is a function which is 0 when x<0 and 1 when x≧0 (or 0 when x≦0 and 1 when x>1).

$$R(v) = W(v) + \Sigma \theta(R(V_i)) R(V_i) \qquad (6)$$

$V_i \in S(v)$

The load of the leaf node equals the weight of the leaf node. The load of a vertex (parent node) as a parent equals a value obtained by adding a positive load of a vertex (child node) as a child to the weight of the parent node.

This value corresponds to the load in moving each vertex to the right side. A vertex $v_A$ has a weight of −5. However, the vertex $v_A$ is prevented by children and grandchildren on the right side from moving to the right. The degree of prevention is known from the load value of the vertex of each child or grandchild. More specifically, since the load of a vertex $v_C$ is +7, the vertex $v_C$ prevents the vertex $v_A$ from moving to the right side. On the other hand, since the load of a vertex $v_B$ is −3, the vertex $v_B$ does not prevent the vertex $v_A$ from moving to the right side. That is, since $\theta(R(v_B)) = \theta(-3) = 0$, and $\theta(R(v_C)) = \theta(+7) = 1$, the load $R(v_A)$ of the vertex $v_A$ is given by $R(v_A) = W(v_A) + R(v_C) = (-5) + (+7) = +2$.

As is apparent from FIG. 16, the cost can be decreased by increasing the coordinate values of all vertexes having the vertex $v_B$ with a negative load as the tree root (i.e., vertexes $v_B$, $v_D$, and $v_E$) (by moving vertexes $v_B$, $v_D$, and $v_E$ to the right).

Figure 3:
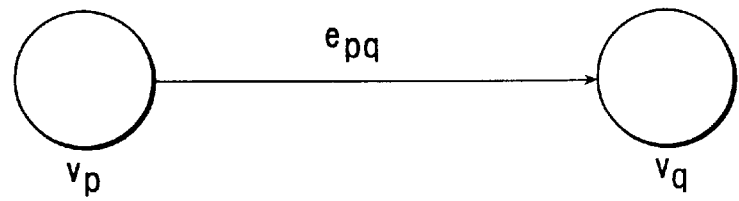
FIG. 3 is a view for explaining a constraint graph.
Figure 4:
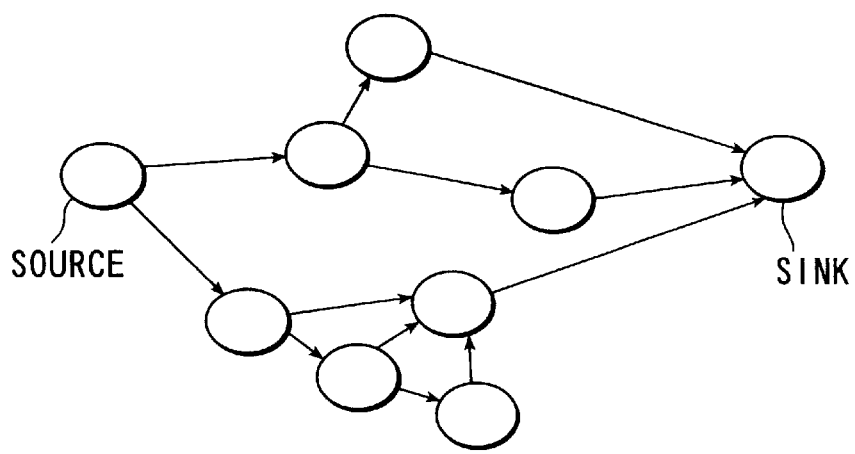
FIG. 4 shows a general constraint graph having a sink and a source.
Figure 5:
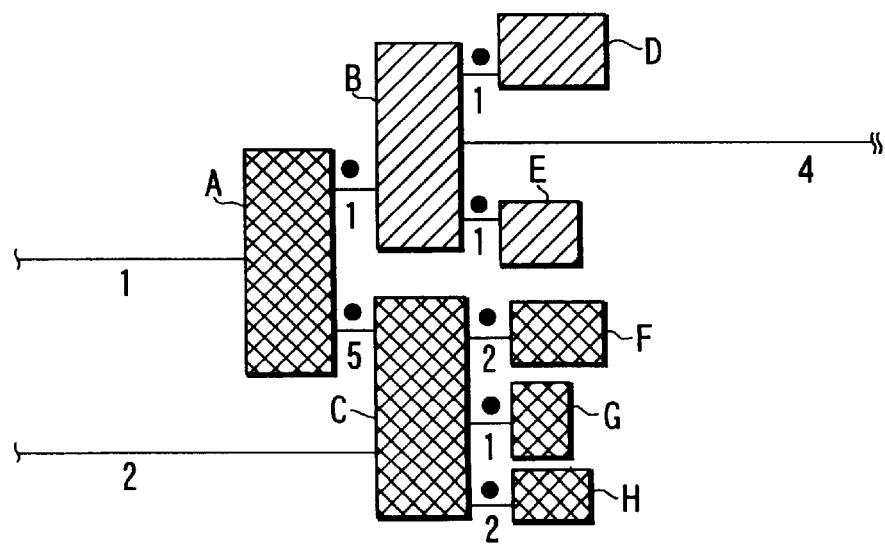
FIG. 5 shows an object arrangement.
Figure 6A:
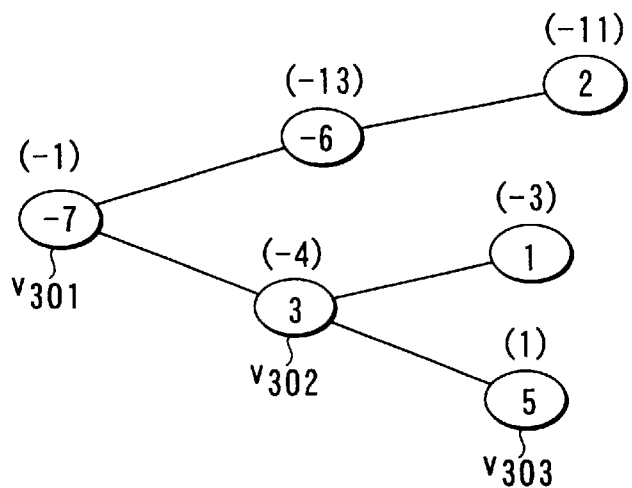
FIGS. 6A and 6B are views showing a tree so as to explain an accumulated value.
Figure 6B:
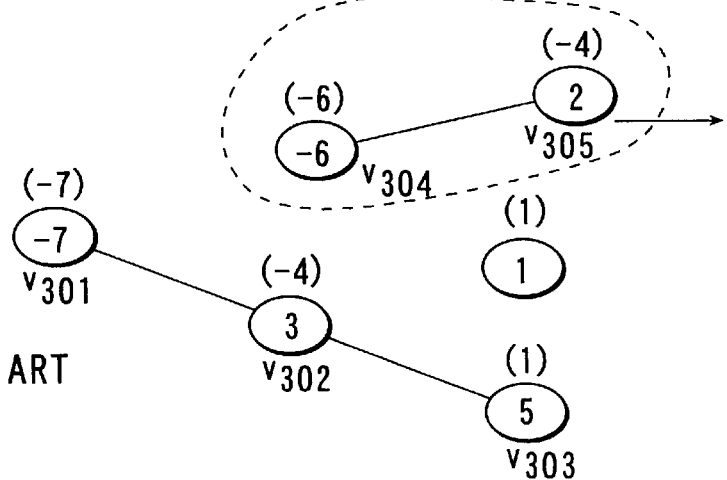

As has been described with reference to FIGS. 6A and 6B, in the conventional group improvement method, the objects B, D and E in the layout shown in FIG. 5 cannot be specified and thus cannot be moved. According to this embodiment, however, the objects B, D, and E of the layout in FIG. 5 can be moved, and the cost can be further reduced.

The arrangement and operation of the wire length minimization section 10 shown in FIG. 8 will be described below in detail. As shown in FIG. 10, the wire length minimization section 10 comprises a weight determining section 100, an object moving section 102, a completion determining section 104, and a line inversion section 106.

The weight determining section 100 obtains the weights of vertexes corresponding to the objects (step S21 in FIG. 11). The object moving section 102 moves the objects, i.e., selects vertexes to be moved, determines the moving amount, updates the coordinate values of the vertexes of the constraint graph, updates the tree structure, and updates the load within the range where the magnitude relationship of the coordinates of the two ends of a line in the compaction direction does not invert (step S22 in FIG. 11). The completion determining section 104 determines whether wire length minimization processing is to be ended, whether processing is to be performed again after line inversion processing is performed, or whether processing is to be performed again without performing line inversion processing (steps S23 and S24 in FIG. 11). The line inversion section 106 performs line inversion processing of correcting the constraint graph, the tree, and the cost function such that the connection relationship between two vertexes corresponding to a line having a length of 0 in FIG. 15 is inverted (step S25 in FIG. 11).

Object movement processing at step S22 in FIG. 11 will be described below in detail with reference to FIG. 12 and the process of a specific example.

FIGS. 17 to 20 show object movement in wire length minimization processing. In FIG. 17 to 20, the priority of each wire is shown. When the interval between objects cannot be reduced anymore, a bullet is added to the wire between the objects. When the interval has a margin to be reduced, the value (slack) is put in parentheses and added to the wire. For example, the interval between the objects A and B shown in FIG. 17 can be reduced by 3. The interval between the objects B and D cannot be reduced anymore.

Figure 22:
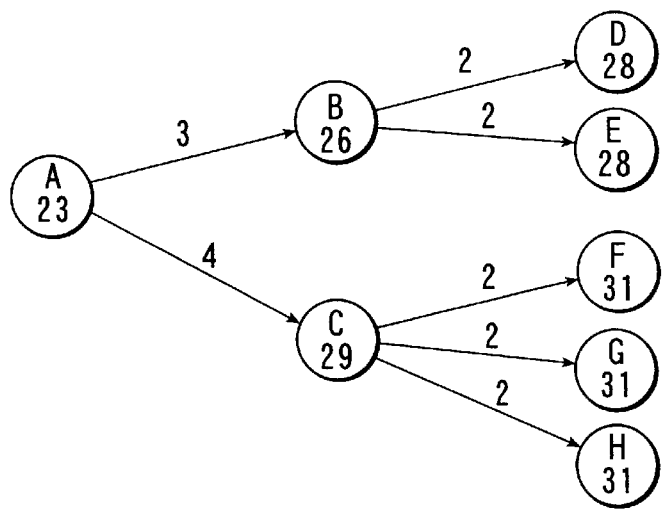
FIG. 22 shows a constraint graph corresponding to the state shown in FIG. 18.
Figure 23:
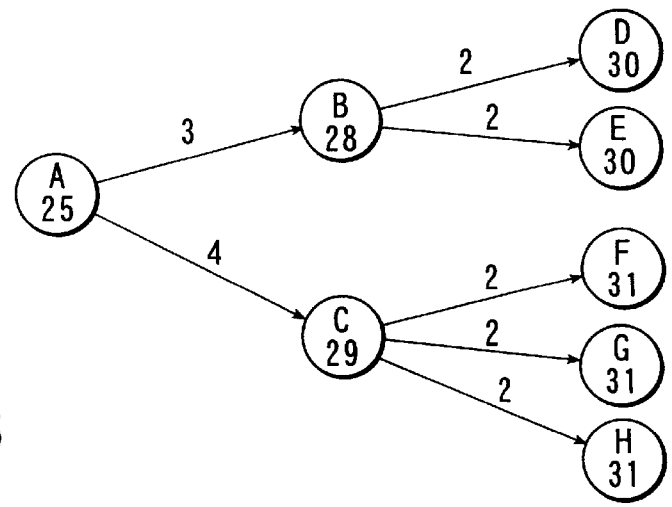
FIG. 23 shows a constraint graph corresponding to the state shown in FIG. 19.
Figure 24:
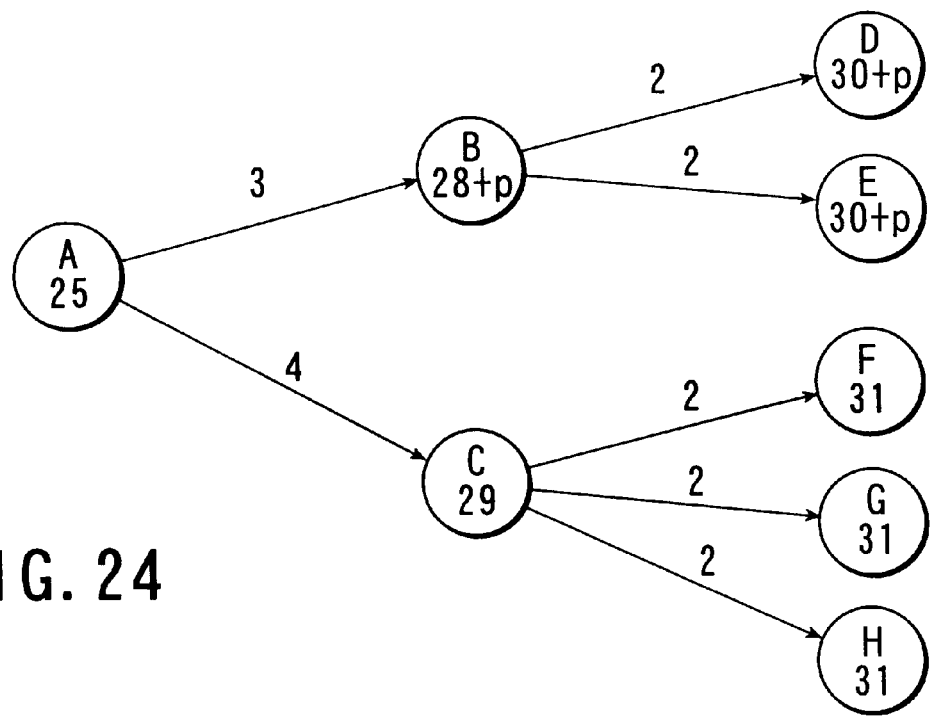
FIG. 24 shows a constraint graph corresponding to the state shown in FIG. 20.

FIG. 21 shows a constraint graph created by the constraint graph creating section 6 from the layout data and design rule. In FIG. 21, a circle representing a vertex has the identification information and the vertex coordinate of a corresponding object. The vertex coordinate value is sequentially updated in accordance with movement of the object, as shown in FIGS. 22 to 24. That is, the vertex coordinates shown in FIGS. 21 to 24 correspond to the arrangements in FIGS. 17 to 20. A value added to a branch represents an interval (limit proximity distance) necessary between two vertexes corresponding to the branch.

The slack between objects can be obtained from the coordinate values of two vertexes of the constraint graph and the limit proximity distance of the branch. In FIG. 21, the position of the vertex $v_B$ is represented by 26, and that of the vertex $v_A$ is represented by 20, so the difference is 6. The interval necessary between the vertexes $v_A$ and $v_B$ is 3. Therefore, the margin between the vertexes $v_A$ and $v_B$ is 3. In correspondence with this, the margin between the objects A and B is 3 in FIG. 17. In actual processing, the margin (slack) between objects is calculated using the constraint graph.

FIGS. 25 to 28 show changes in tree during processing.

As a condition for moving a group, the load of the root of the tree has a negative value. Therefore, the coordinate values of all vertexes included in the tree having a root with a negative load are increased. If YES at step S35 in FIG. 12, processing of increasing the coordinate values of the vertexes of the tree is performed. If NO at step S35, the next tree is selected.

To actually move a tree, the moving amount must be determined. When a tree is moved to the right side, an equality sign holds between the constraint condition of a vertex included in the tree and another vertex not included in the tree. Further movement of the tree to the right side violates the constraint condition. Between two vertexes at both ends of a branch corresponding to the constraint condition, a vertex included in the tree is called a critical node, and a vertex not included in the tree is called a limit node. The movement amount of the tree at this time is a slack. At step S37, the tree is moved by the amount of the slack. At step S38, since the limit node is added to the tree, the limit node is also moved as part of the tree together with the remaining nodes.

Figure 25:
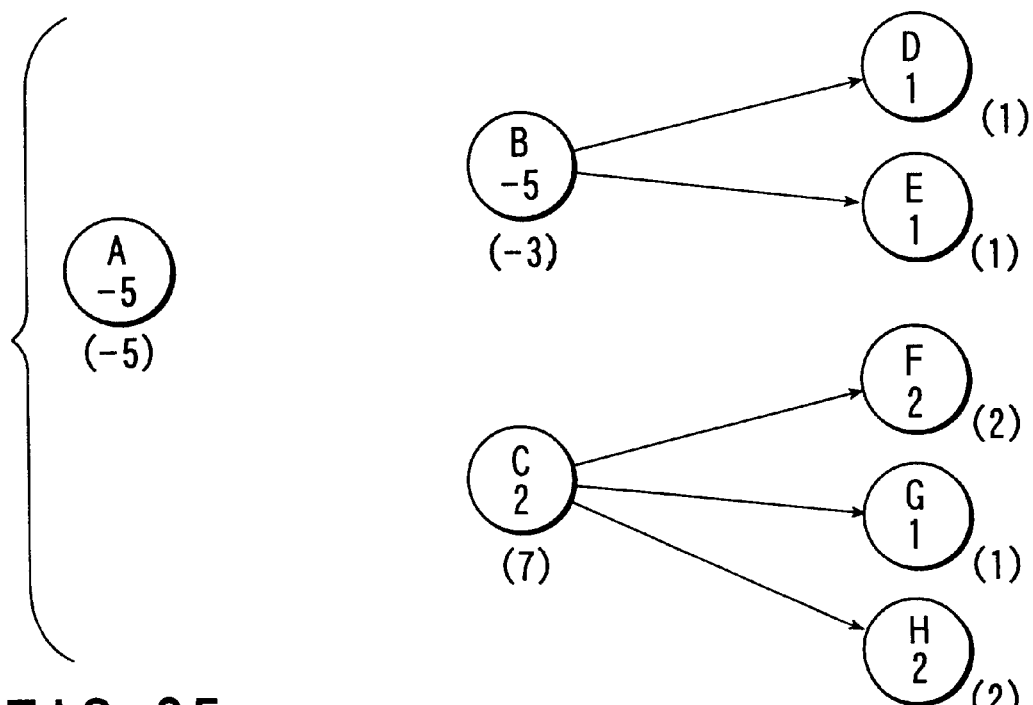
FIG. 25 shows a tree corresponding to the state shown in FIG. 17.

Assume that the objects are arranged as shown in FIG. 17 (the tree is shown in FIG. 25). Immediately after the start of processing, processing is started at step S31 while regarding, for each vertex, load=weight. The tree is updated every time step S38 is executed.

At step S33, assume that the root A is selected. It is determined at step S35 that the load of the root is negative, as is apparent from FIG. 25, and the flow advances to step S36.

In moving the object A to the right side, the object B has the smallest margin, as shown in FIG. 17. At step S36, the limit node is the vertex $v_B$, the critical node is the vertex $v_A$, and the slack is 3. These can be calculated with reference to the constraint graph in FIG. 21. The slack can be obtained by comparing the value (limit proximity distance) of the branch extending from the vertex $v_A$ with the difference between the coordinate value of the ending point of the branch and that of the starting point. The slacks of all branches extending from the vertex $v_A$ are obtained, and from the calculated slacks, the minimum slack and the limit node and critical node corresponding to the branch are obtained.

The flow advances to step S37. Since the slack is 3, the coordinate value of the vertex $v_A$ is changed from 20 to 23, so the branch between the vertexes $V_A$ and $V_B$ becomes tight.

Figure 18:
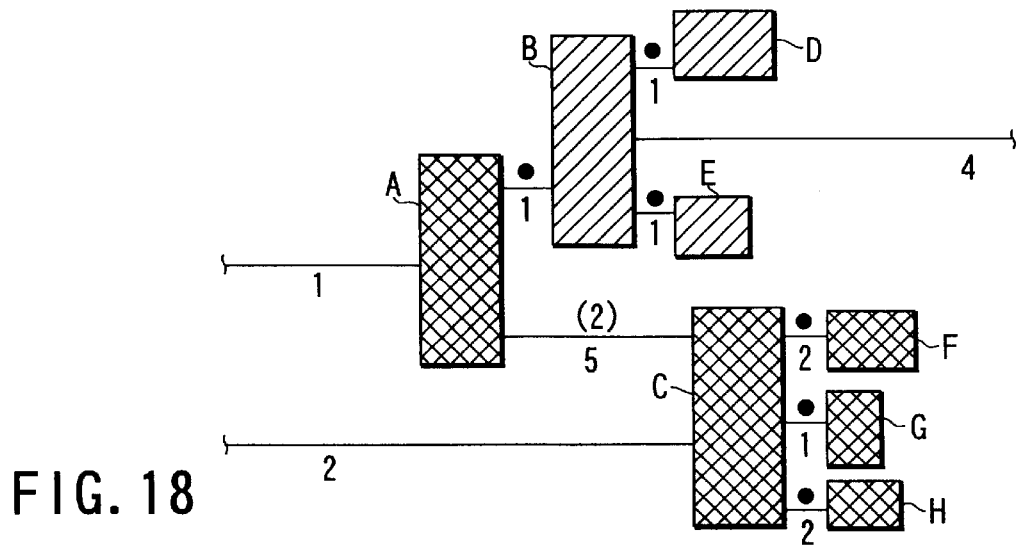
FIG. 18 shows an object arrangement changed from the state shown in FIG. 17.
Figure 26:
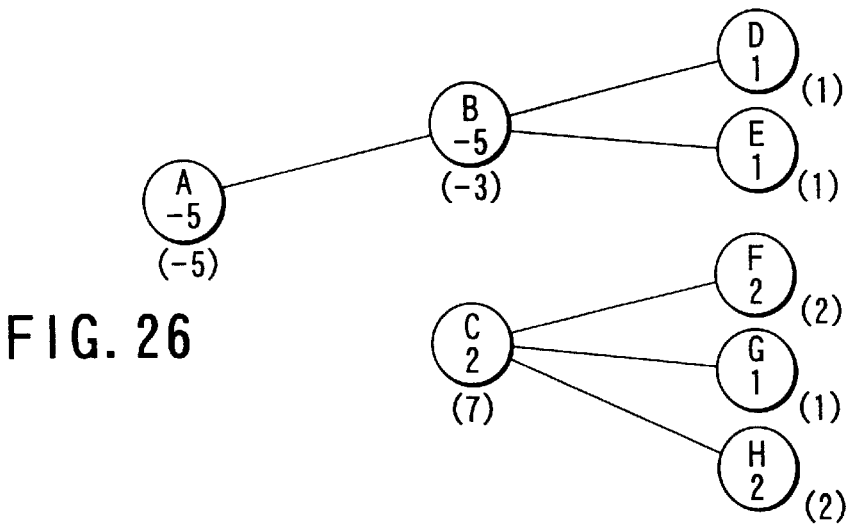
FIG. 26 shows a tree corresponding to the state shown in FIG. 18.

As a result, the arrangement changes as shown in FIG. 18. A bullet is added between the vertexes $V_A$ and $V_B$. The tree is also changed at step S38, as shown in FIG. 26.

The flow returns to step S35. Since the load of the root A of the tree is negative, the flow advances to step S36 again.

Figure 19:
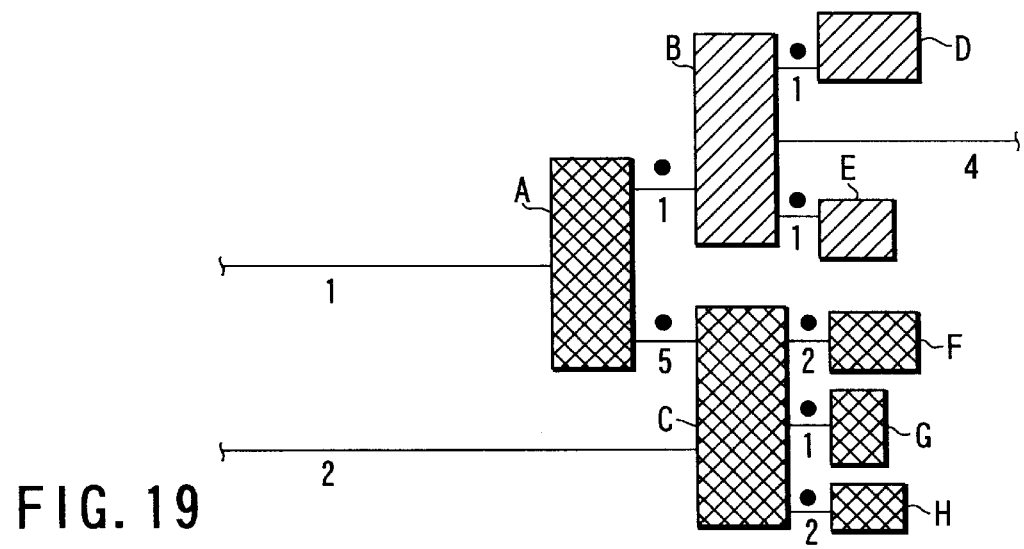
FIG. 19 shows an object arrangement changed from the state shown in FIG. 18.
Figure 27:
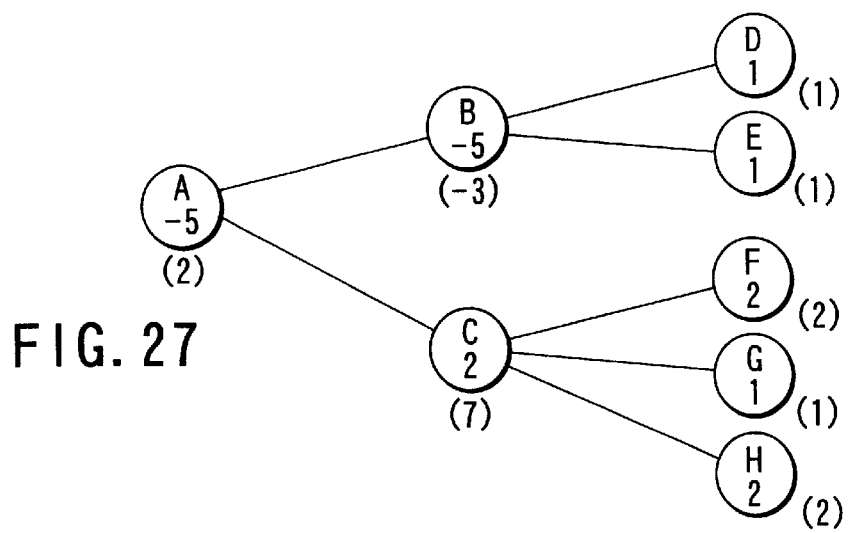
FIG. 27 shows a tree corresponding to the state shown in FIG. 19.
Figure 28:
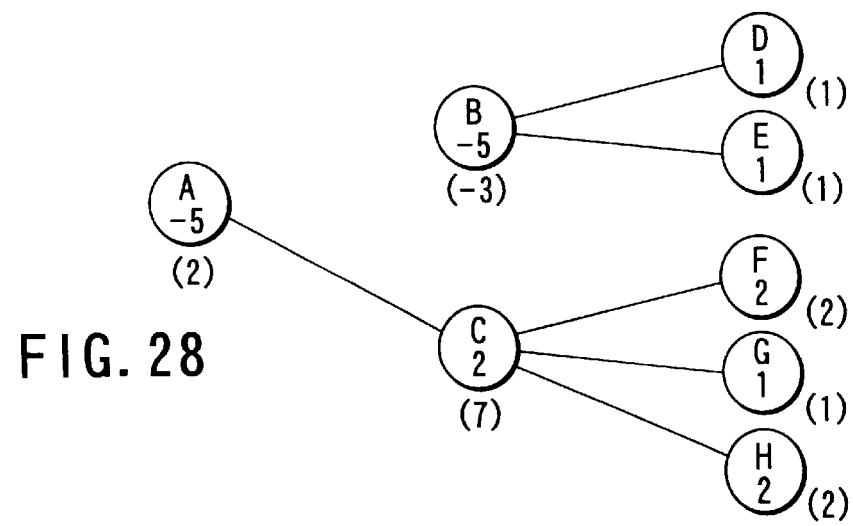
FIG. 28 shows a tree corresponding to the state shown in FIG. 20.

Steps S36, S37, and S38 are performed again, and the arrangement and the tree are changed as shown in FIGS. 19, 23, and 27. Since the load of the root becomes positive, the flow returns from step S35 to step S33. Processing for the tree having the vertex $v_A$ as the root is ended, and processing for the next tree is started.

Assume that the vertex $v_C$ is selected at step S33. As shown in FIG. 27, the load of the vertex $v_C$ is positive, so the flow returns from step S35 to step S33 again. The vertex having a positive load is skipped.

Figure 20:
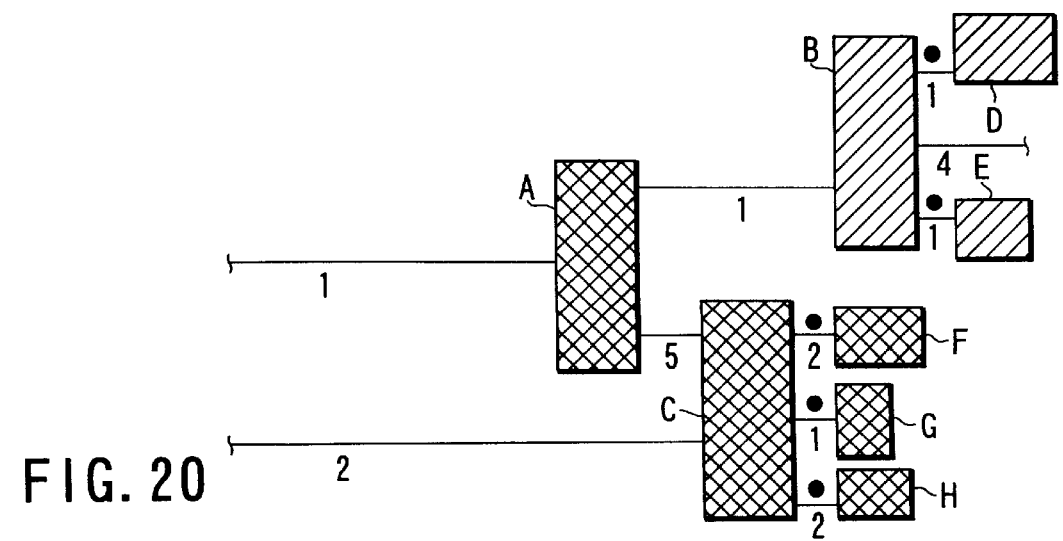
FIG. 20 shows an object arrangement changed from the state shown in FIG. 19.

Assume that the vertex $v_B$ is selected at step S33. Since the vertex $v_B$ has a negative load of −5, as shown in FIG. 27, so the flow advances to step S36. The tree to be processed at this time is a tree having the object B as a root. At this time point, the tree is in a state shown in FIG. 28. By repeating the above processing, the objects B, D, and E move to the right side, as shown in FIGS. 20 and 24.

Figure 29:
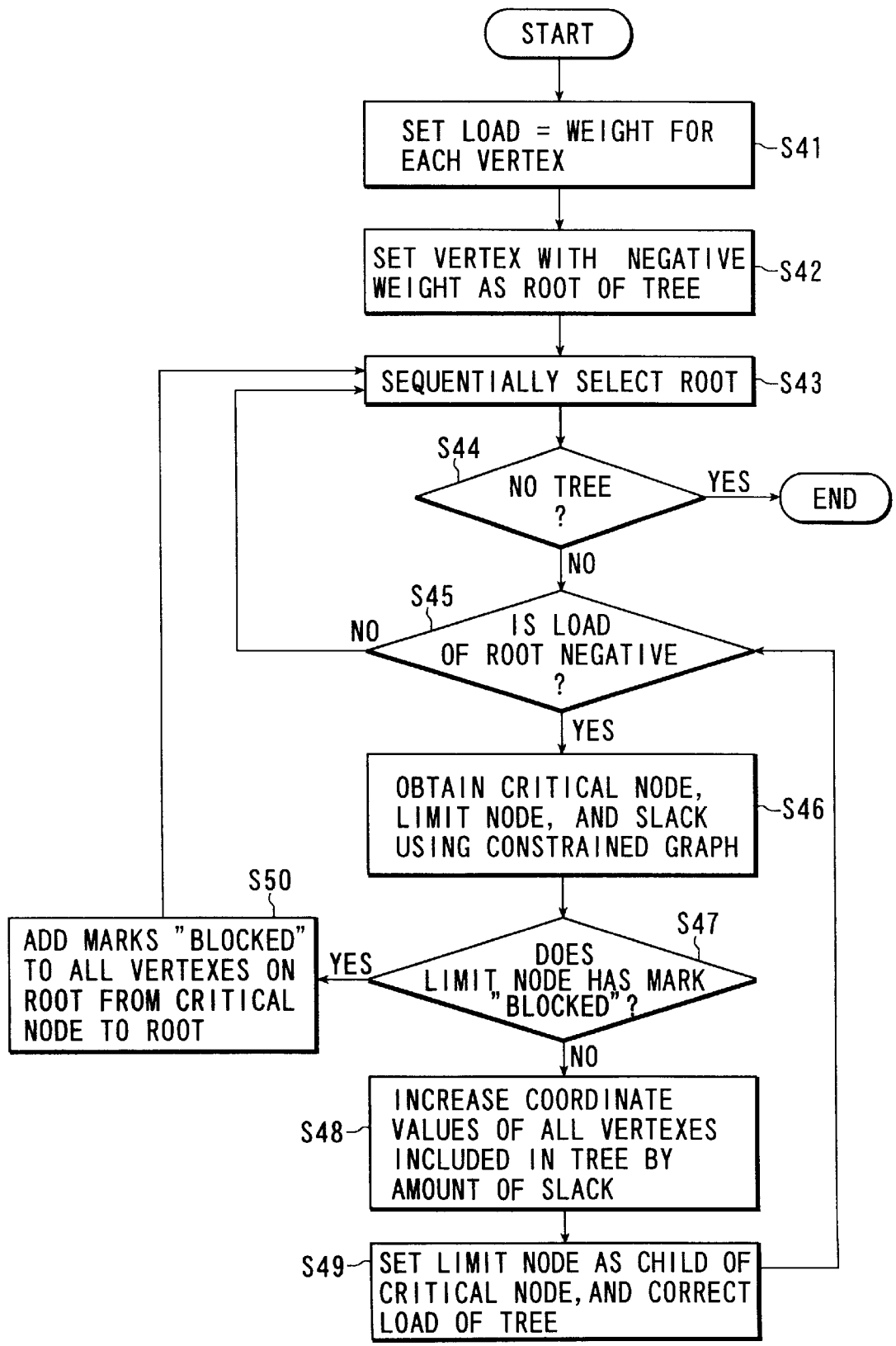
FIG. 29 is a flow chart showing another procedure of weight determination processing and object movement processing of the wire length minimization section shown in FIG. 8.

FIG. 29 shows another example of the object movement processing S22 in FIG. 11. In FIG. 29, the procedure in FIG. 12 is slightly corrected. The different points will be described.

As a condition for moving a group of objects, the root of a tree must have a negative load. A tree having, as a root, a vertex always having a positive load need not be constituted. As is apparent from equation (6), as far as the weight of the root of the tree is positive, the load of the root of the tree does not become negative. Therefore, at step S42, only vertexes having negative weights are selected.

Prior to processing in FIG. 29, a tight branch is traced from the sink of the constraint graph in the reverse direction, and a mark BLOCKED is added to each vertex in the traced range. This processing is preferably executed immediately after completion of processing of the area minimization section 8. In this case, the tight branch means a branch for which the magnitude of the constraint condition represented by the branch equals the distance between the vertexes at the two ends of the branch. At this time, when the vertex having the mark BLOCKED is moved, the coordinate value of the sink of the graph increases, and the layout area increases.

At step S47, it is checked whether the limit node has the mark BLOCKED. If YES at step S47, marks BLOCKED are added to all vertexes on the route from the critical node to the root at step S50. If NO at step S47, movement processing is performed at steps S48 and S49. When the layout area must not be increased, since the vertexes are marked with BLOCKED so that they are not moved.

Upon completion of object movement processing, the completion determining section 104 in the wire length minimization section 10 determines whether line inversion processing is to be performed and the processing cycle is to be performed again, the processing cycle is to be executed again without performing line inversion processing, or processing is to be ended.

The completion determining section 104 uses the following completion determination conditions.

(1) All object positions are not corrected.

(2) All object positions are not corrected for two cycles.

(3) The repetition count exceeds a predetermined repetition count t1 designated by the user.

(4) A change in cost (e.g., (preceding cost−current cost), (preceding cost−current cost)/current cost, or the like) is smaller than a value s1 designated by the user.

(5) Above condition 1 or 2 and conditions 3 and/or 4 are appropriately ORed.

The convergence state may be presented, and the repetition count may be determined by the user and input or updated. Alternatively, the convergence state may be presented, and when the user instructs to end processing, processing may be ended independently of the above conditions.

To present the convergence state, a portion where the layout is changed may be specified, and the difference between the layout before change and that after change may be displayed. Alternatively, the cost change state or the change states of the total wire length and cost may be displayed.

The user may instruct to switch between a mode in which the convergence state is presented every time a vertex is moved and a mode in which the convergence state is presented upon determining completion.

If the above completion conditions are not satisfied, the processing cycle is executed again. At this time, whether line inversion processing is to be performed is determined based on the following conditions.

(a) All object positions are not corrected (except when the above condition (1) is employed).

(b) The repetition count exceeds a predetermined repetition count t2 designated by the user (when the above condition (3) is employed, t2<t1).

(c) Conditions (a) and (b) are ORed.

Figure 30:
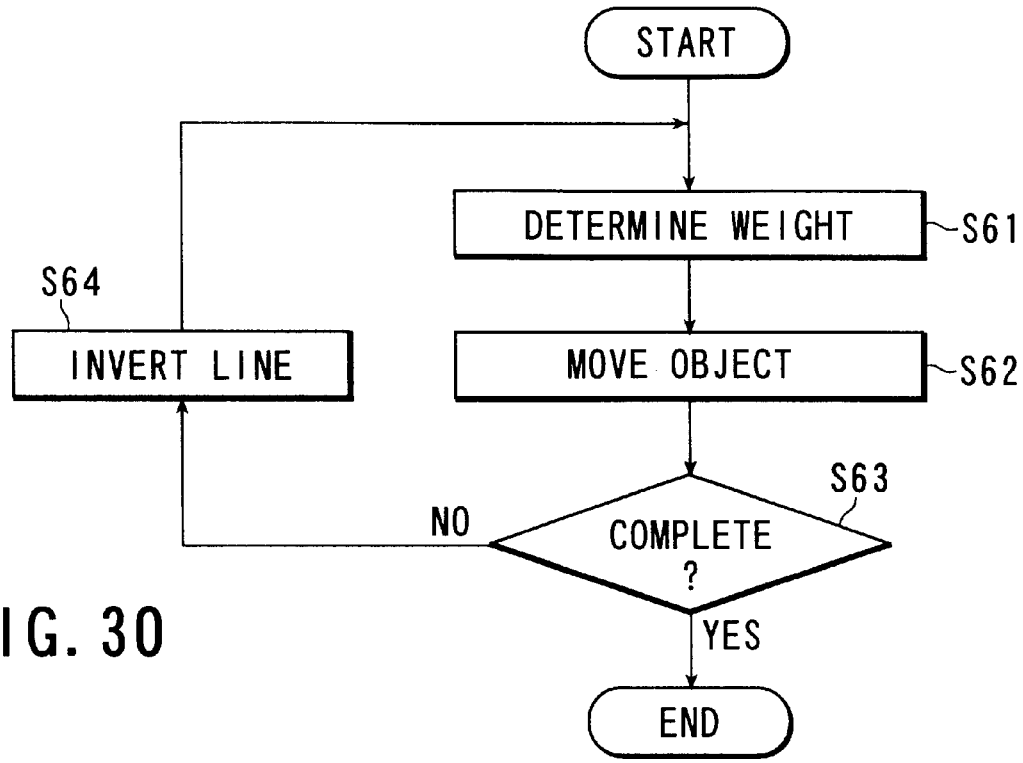
FIG. 30 is a flow chart showing another procedure of processing of the wire length minimization section.
Figure 31:
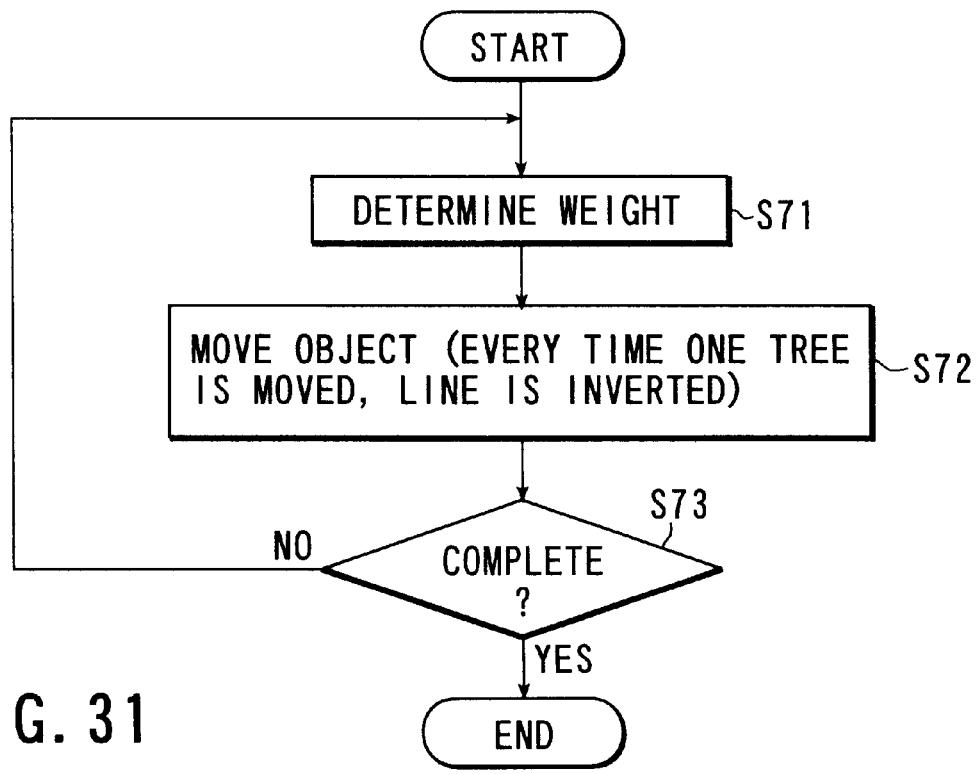
FIG. 31 is a flow chart showing still another procedure of processing of the wire length minimization section.

If completion is not determined, the wire length minimization section 10 shown in FIG. 11 determines whether line inversion processing is to be performed, performs line inversion processing, and then executes weight determination and object movement processing again. However, the operation after completion determination is not limited to this, and various changes and modifications can be made. For example, only when the completion conditions are satisfied, line processing is performed, and then, weight determination processing and object movement processing are executed until the completion conditions are satisfied once more. If the processing cycle is to be executed again, line inversion processing is always executed, as shown in FIG. 30 (step S64). Alternatively, every time objects corresponding to one tree are moved, line inversion processing is executed, as shown in FIG. 31 (step S72).

When the line length becomes 0, the line inversion section 106 performs line inversion processing of replacing the left and right of the line. More specifically, the connection relationship and the limit proximity distance in the constraint graph, the tree structure, and the weight and load of the tree are corrected such that the relationship between the starting point and ending point of two vertexes corresponding to the two ends of the line is inverted. The cost function uses the weight of the vertex after correction. In this object movement processing, the objects are moved without inverting the positional relationship between vertexes. When the objects cannot be moved anymore, and the distance between vertexes becomes 0, further object movement may be allowed by correcting the constraint graph, the tree, and the cost function such that the positional relationship between vertexes is inverted.

Upon completion of wire length minimization processing, the coordinate data of all layout patterns are re-calculated based on, e.g., the table representing the relationship between the patterns, vertexes corresponding to the patterns, and the coordinates relative to the vertex coordinates along the compaction direction, and the vertex coordinates obtained from the constraint graph, thereby generating IC layout data after wire length minimization processing. In area minimization processing or wire length minimization processing, every time a vertex is moved, the coordinate of the pattern belonging to the object corresponding to the vertex may be obtained, and the IC layout data may be updated every time.

The completion determining section 12 determines whether the completion condition is satisfied (step S16 in FIG. 9). If YES at step S16, processing is ended. If NO at step S16, the compaction direction setting section 4 changes the compaction direction, and the same compaction processing as described above is repeatedly performed. Determination is done based on, e.g., whether a predetermined number of times of repetition are complete. For example, completion is determined when each of x-direction processing and y-direction processing is alternately repeated twice, or a total of four times of processing are complete.

When the completion determining section 12 determines that the completion condition is satisfied, the output section 14 outputs the IC layout data which has undergone compaction processing (step S17 in FIG. 9).

A case wherein a movable object cannot be moved in the above-described basic procedure will be described next with reference to FIGS. 32A to 32D.

Figure 32A:
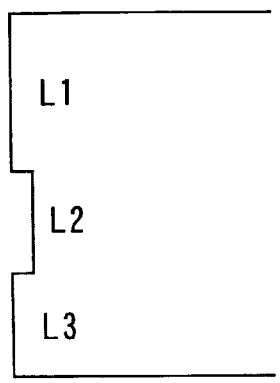
FIGS. 32A to 32D are views for explaining merge processing.
Figure 32C:
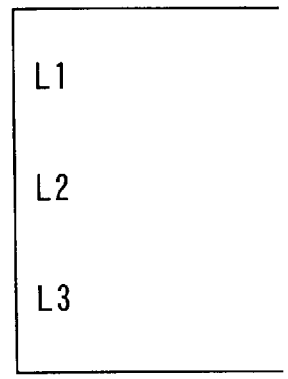
Figure 32B:
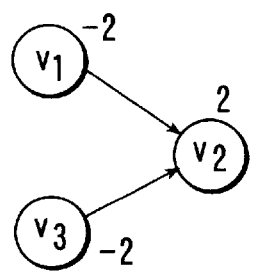

Lines L1, L2, and L3 in FIG. 32A correspond to vertexes $v_1$, $v_2$, and $v_3$ in FIG. 32B, respectively. Since movement accompanied with replacement of the two ends of a line is inhibited, branches having a constraint condition value of 0 are present between the vertexes $v_1$ and $v_2$ and between the vertexes $v_3$ and $v_2$. Because of the constraint condition, the lines L1 and L3 cannot move to the right side across the line L2. The weight of each vertex is obtained by setting the priority of each line to be 1. Weights suffixed to the vertexes are obtained. Since the weight of the line L2 is 2 (>0), the line L2 does not move to the right side by itself. Since the sum of weights of all vertexes is negative, the wire length can be minimized by moving the entire layout to the right side. However, this graph cannot be stored in a tree, the entire layout cannot be moved to the right side, and processing is ended in the state shown in FIG. 32C.

Figure 32D:
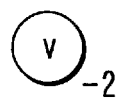

When the line length is 0, or the branch between vertexes corresponding to the left and right ends of the line is tight, the two ends of the line refer to the same vertex. The weight of the vertex equals to the weight of the referred vertex. Since the sum of weights of the tree vertexes in FIG. 32A is −1, the weight of a new vertex v is −1, as shown in FIG. 32D. In FIG. 32D, the line can be moved to the right side to minimize the wire length.

Figure 33:
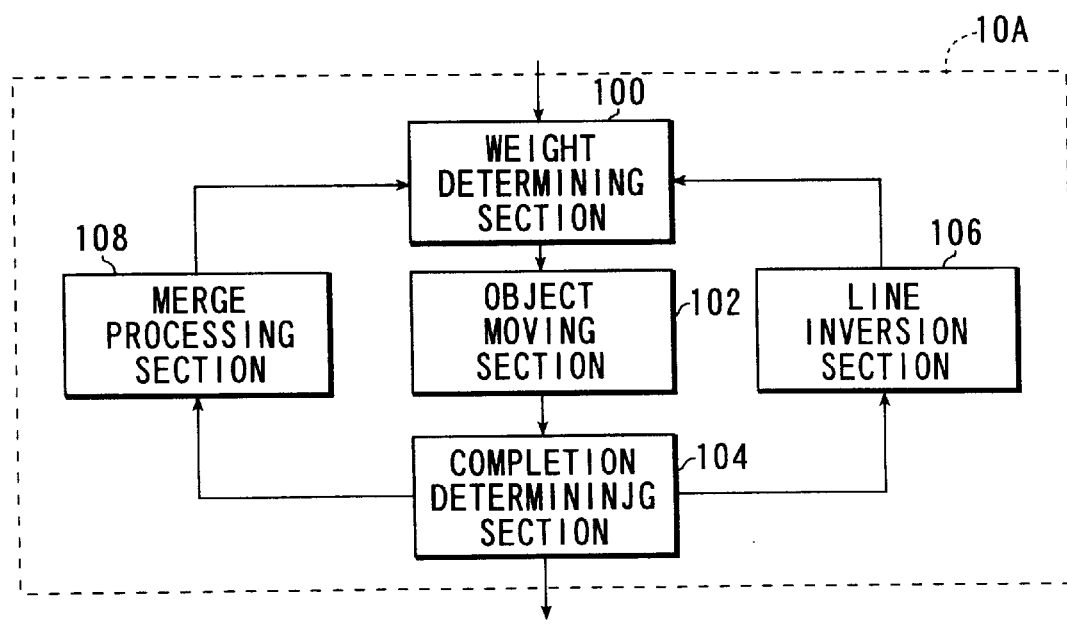
FIG. 33 is a block diagram showing another internal arrangement of the wire length minimization section shown in FIG. 8.
Figure 34:
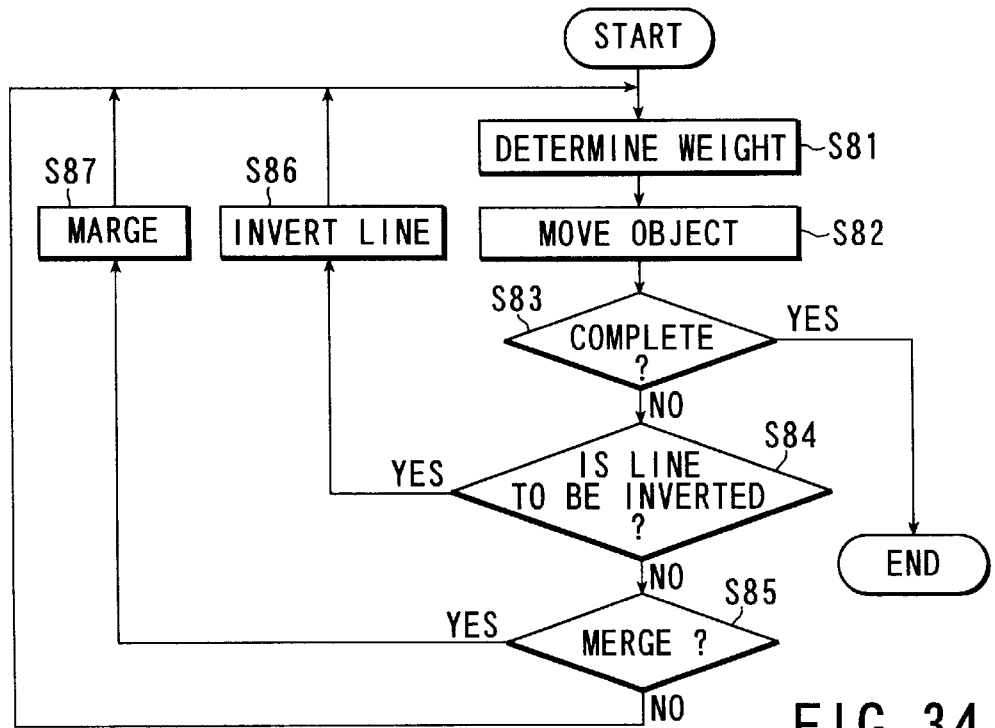
FIG. 34 is a flow chart showing the procedure including merge processing of the wire length minimization section.

FIG. 33 shows the internal arrangement of the wire length minimization section 10A for executing this processing. FIG. 34 shows the procedure of processing. The wire length minimization section 10A basically has the same arrangement as in FIG. 10 except a merge processing section 108. When the completion determining section 104 determines that merge processing is necessary (step S85), the merge processing section 108 performs merge processing for lines and vertexes, changes the constraint graph, and corrects the load (step S87), and then, processing is continued.

The completion determining section 104 determines the necessity of merge processing when the accumulation count used by the completion determining section 104 to determine line inversion processing is an integer multiple of a predetermined count, and in this case, merge processing is performed instead of line inversion processing. Assume that the predetermined count is 4. When line inversion processing is performed three times, and it is determined again that line inversion processing is to be performed, merge processing is performed instead of line inversion processing at this cycle.

Other than the above method, various methods are available. For example, when the above-described completion condition is satisfied, and line inversion processing is performed, weight determination processing and object movement processing are executed again. When the above-described completion condition is satisfied again, merge processing is performed, and then, weight determination processing and object movement processing are executed again. As shown in FIG. 30, when the processing cycle is to be executed again, line inversion processing is always executed. As shown in FIG. 31, every time an object corresponding to a tree is moved, line inversion processing is executed. When the accumulation count of line inversion processing is an integer multiple of a predetermined count, merge processing is performed instead of line inversion processing. As shown in FIG. 30, when the processing cycle is to be executed again, line inversion processing is always executed, or as shown in FIG. 32, every time an object corresponding to a tree is moved, line inversion processing is executed, and when the same condition as that for line inversion processing ((a), (b), or the like) is satisfied, merge processing is performed.

In the above description, the object does not include the two ends of the line in the compaction direction. However, a line not to be subjected to compaction may be designated. In this case, a line not to be subjected to compaction is handled like a pattern except a wire.

Alternatively, a specific range where the arrangement need not be changed may be designated in the layout. In this case, all lines within the specific range are handled like a pattern except a wire.

The functions described in this embodiment can be realized as hardware or software. To realize them as software, the above-described procedures or means may be practiced as a computer readable medium storing a program to be executed by a computer.

As described above, according to this embodiment, a tree is formed using, as nodes, a plurality of objects having a predetermined positional relationship, and the load of each node is sequentially obtained from the leaf to the root of the tree while reflecting the load of the leaves. Therefore, a group of objects to be moved can be easily obtained based on the loads, and the objects can be efficiently and effectively moved to reduce the cost.

Other embodiments of the present invention will be described next. The same reference numerals as in the first embodiment denote the same parts in the second embodiment, and a detailed description thereof will be omitted.

Second Embodiment

This embodiment is related to improvement of a technique of minimizing a wire length in one-dimensional compaction of a layout of, e.g., a semiconductor integrated circuit and, more particularly, to a technique of more effectively minimizing a wire length by using a variety of combinations of vertexes to be moved for wire length minimization in a constraint graph, as compared to the prior art.

Figure 35:
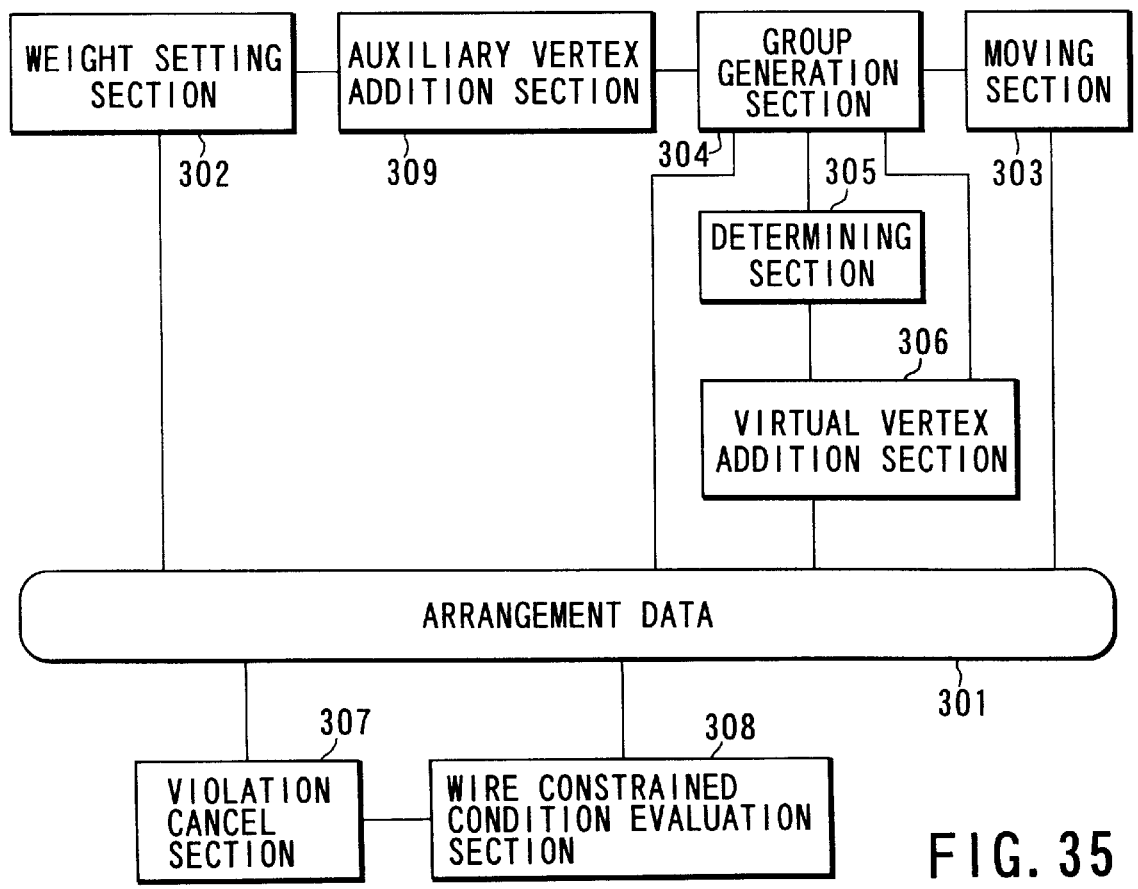
FIG. 35 is a block diagram of a wire length minimization apparatus according to the second embodiment of the present invention.

FIG. 35 is a functional block diagram showing the arrangement of the second embodiment which relates to wire length compaction in the compactor.

Arrangement data 301 includes all pieces of information necessary for wire length minimization processing, i.e., the positional relationship between objects of a layout, the constraint graph between objects, the priority of a wire, which represents the priority of wire length minimization designated by the user, the constraint graph obtained based on the above data, and the like. A weight determining section 302 determines weights of all vertexes including an auxiliary vertex on the constraint graph based on the priority of a wire, the relationship between the end point and the vertex of a wire, and the relationship between the vertex and the auxiliary vertex.

A moving section 303 moves the vertexes on the constraint graph to minimize the total wire length. A group generation section 304 puts, into a group, vertexes to be simultaneously moved, thereby minimizing the wiring cost. A determining section 305 determines whether a virtual vertex is to be added. A virtual vertex addition section 306 adds a virtual vertex to the constraint graph based on determination by the determining section 305.

A violation cancel section 307 cancels constraint graph violation between objects prior to wire length minimization processing. A wire constraint condition evaluation section 308 gives the upper limit value of the length as a constraint condition to each line constituting a wire included in the given layout. The priority of each wire is designated in advance. The wire constraint condition evaluation section 308 gives a constraint condition allowing extension within the range designated by the user to wires within the range designated by the user such that an important wire with high priority does not exceeds the current length, and a wire with relatively low priority is allowed to extend to some degree. An auxiliary vertex addition section 309 adds auxiliary vertexes corresponding to the minimum and minimum values (coordinate values) of a line to the constraint graph prior to wire length minimization processing.

Figure 36:
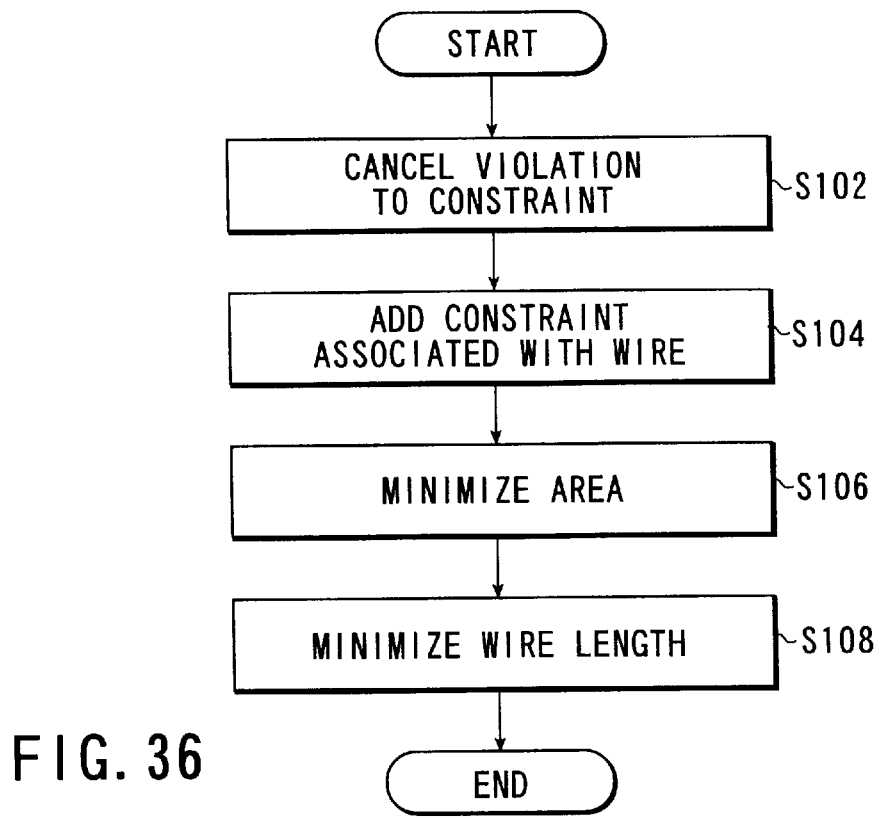
FIG. 36 is a flow chart showing wire length minimization processing of the second embodiment.

The operation of the second embodiment will be described with reference to FIG. 36. The weight of each vertex is calculated by the weight determining section 302 in advance and recorded in the arrangement data 301. The operation will be roughly divided into three sections: (1) processing prior to wire length minimization processing, (2) virtual vertex introduction, and (3) details of the wire length minimization procedure including virtual vertex addition, and described.

(1) Processing Prior to Wire Length Minimization Processing

In this embodiment, a constraint condition is given to the layout based on a design rule such as an interval to be ensured between objects. As shown in FIG. 36, prior to wire length minimization processing, the constraint condition violation is canceled by the violation cancel section 307 in advance (step S102). In addition, the wire constraint condition evaluation section 308 calculates the minimum necessary wire length for satisfying an existing constraint condition or the upper limit of the length of a line for preventing an excess change in layout and adds a constraint condition to satisfy the calculated line length (step S104). A wire can be represented by a polygonal line. Each line segments of a polygonal line is called a line. In this embodiment, a constraint condition is given to each line.

Figure 37:
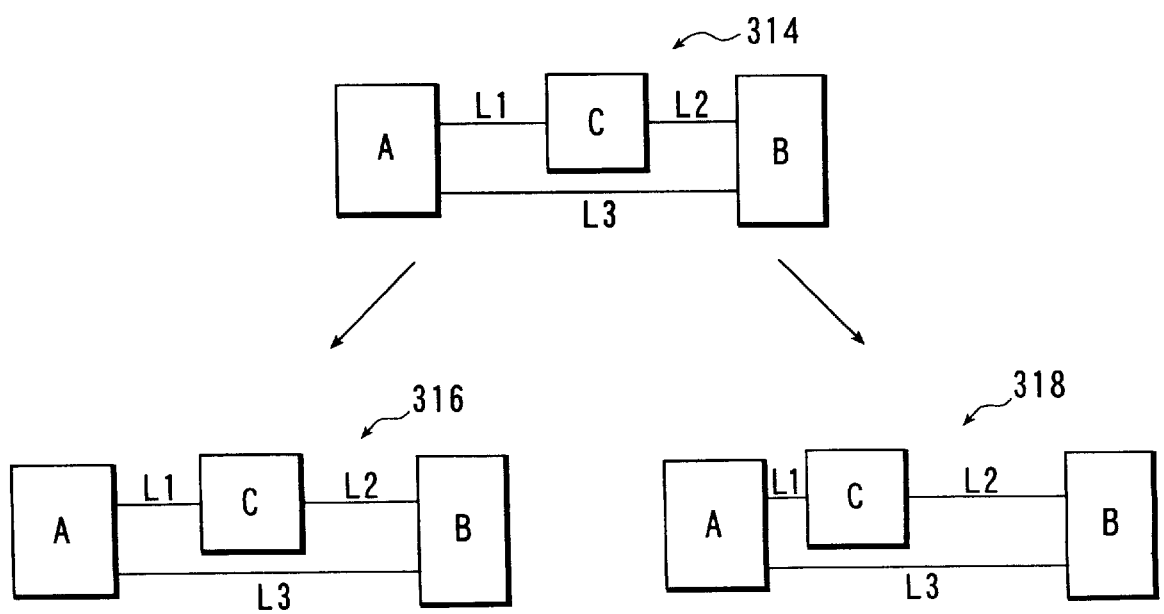
FIG. 37 shows a layout.

In the example shown in FIG. 37, constraint conditions are given such that the lengths of wires L1 and L2 in a layout 314 are used as the upper limit values of the line lengths. When wire length minimization processing is executed under these conditions, excess extension of some lines can be prevented.

However, if an interval violation is present between objects, the constraint condition cannot be set in this state. For example, assume that although the interval between objects A and C must be at least 4, the length of the wire L1 between the objects A and C is 3. In this case, when the length, 3 is employed as the upper limit value of the length of the wire L1, no sufficient interval can be ensured between the objects A and C. In such a case, the necessary interval of 4 between the objects A and C must be given as the upper limit value of the wire L1. To add a constraint condition associated with the wire L3, the layout must be changed in accordance with the constraint condition for defining the interval between the objects A and C and the constraint condition for defining the interval between the objects C and B, and then, the constraint condition associated with the wire L3 must be added.

As the problem on the layout 314, an interval violation is present between the objects. Therefore, before the constraint condition for defining the wire length is added, the interval violation of the original constraint condition is canceled. In this embodiment, the violation cancel section 307 moves objects included in the given layout by a minimum necessary amount to cancel the interval violation. More specifically, as shown in FIG. 36, before area minimization is executed (step S106), the violation of the original constraint condition is canceled (step S102), and then, the constraint condition associated with the wire is added (step S104).

(2) Virtual Vertex Introduction

In this embodiment, in processing of sequentially moving the vertexes, the determining section 305 determines whether a virtual vertex is to be added. In accordance with the determination result, the virtual vertex addition section 306 adds a virtual vertex. With this processing, the vertexes which cannot be put into a single tree because of the current structure of the constraint graph can be simultaneously moved as a tree having a virtual vertex as a root.

Figure 38:
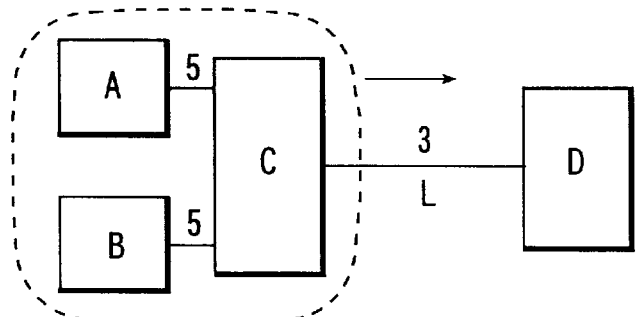
FIG. 38 shows another layout.

For example, assume that a layout shown in FIG. 38 is given, and wire length minimization processing is performed for this layout next to area minimization, as in the prior art. When the prior art is applied to process the example shown in FIG. 38, objects A, B, and C cannot be put into a group. In FIG. 38, since the interval between the objects A and C and that between the objects B and C are sufficiently small, the wires of those portions cannot be minimized anymore. In this case, it is appropriate to perform processing of simultaneously moving the objects A, B, and C as a group to the right side to minimize the total wire length. In FIG. 38, a numerical value added to a wire represents the priority of the wire. In the constraint graph shown in FIG. 39, the weight of each vertex is calculated based on the priorities of wires. A value added to a vertex represents the weight calculated for the vertex.

Figure 41:
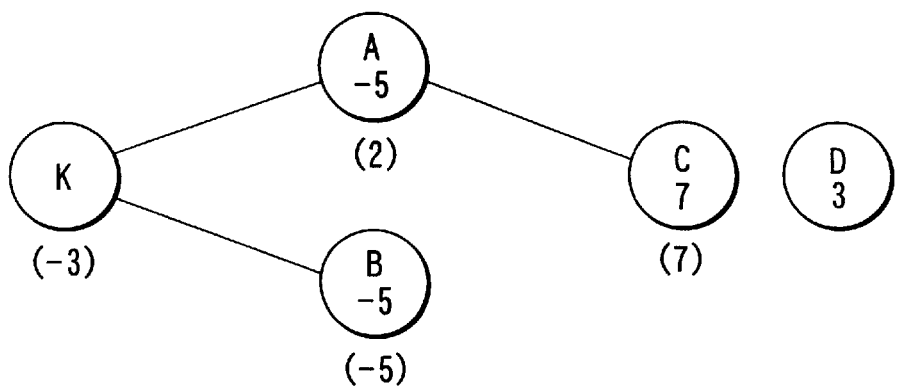
FIG. 41 shows a tree structure to which a virtual vertex is added.

In this embodiment, a virtual vertex K having the objects A and B as children is added to put the objects A, B, and C into a group. FIG. 41 shows state of a tree structure wherein the virtual vertex K is added. To add the virtual vertex K, the following processing is performed.

Figure 40:
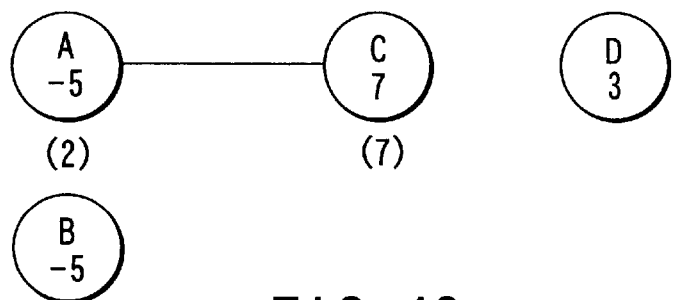
FIG. 40 shows a tree structure.

In the group improvement method, when the moving section 303 is processing the objects A and C, the objects A and C do not move to the right side anymore, as shown in the tree structure of FIG. 40. At this time point, processing of the next vertex B is started without releasing the tree of the objects A and C. During processing of the vertex B, the vertex C appears as a child candidate of the vertex B. When the vertex C is the child of the vertex B, the vertex C is shared by both the vertexes A and B as a child, so the tree structure has an inconsistency. In this state, when the virtual vertex addition section 306 adds the virtual vertex K having the vertexes A and B as children, the vertexes A, B, and C can be put into a tree, as shown in FIG. 41.

The virtual vertex K is not always introduced when vertexes may be shared. Instead, the virtual vertex K is introduced when it is determined by the determining section 305 that a predetermined reference is satisfied. Based on this predetermined reference, it is determined whether when the virtual vertex K is introduced, the cost can be more efficiently reduced. For example, in FIG. 40, the load of the root A is 2, although in FIG. 41, the load of the root K is −3. When the virtual vertex K is introduced, a smaller load can be obtained. By moving the objects corresponding to this tree, the wire length can be efficiently minimized. Therefore, introduction of the virtual vertex K is executed.

The load of the virtual vertex K corresponds to the sum of the loads of the vertexes A and B. As shown in FIG. 41, since the load of the virtual vertex K as a new root is negative, the entire tree including the vertexes A, B, and C is moved to the right side. This means that all of the objects A, B, and C enclosed with a broken line are moved to the right side, as indicated by an arrow in FIG. 38. As a result, a wire length L is minimized, so the total wire length is effectively minimized.

Figure 42:
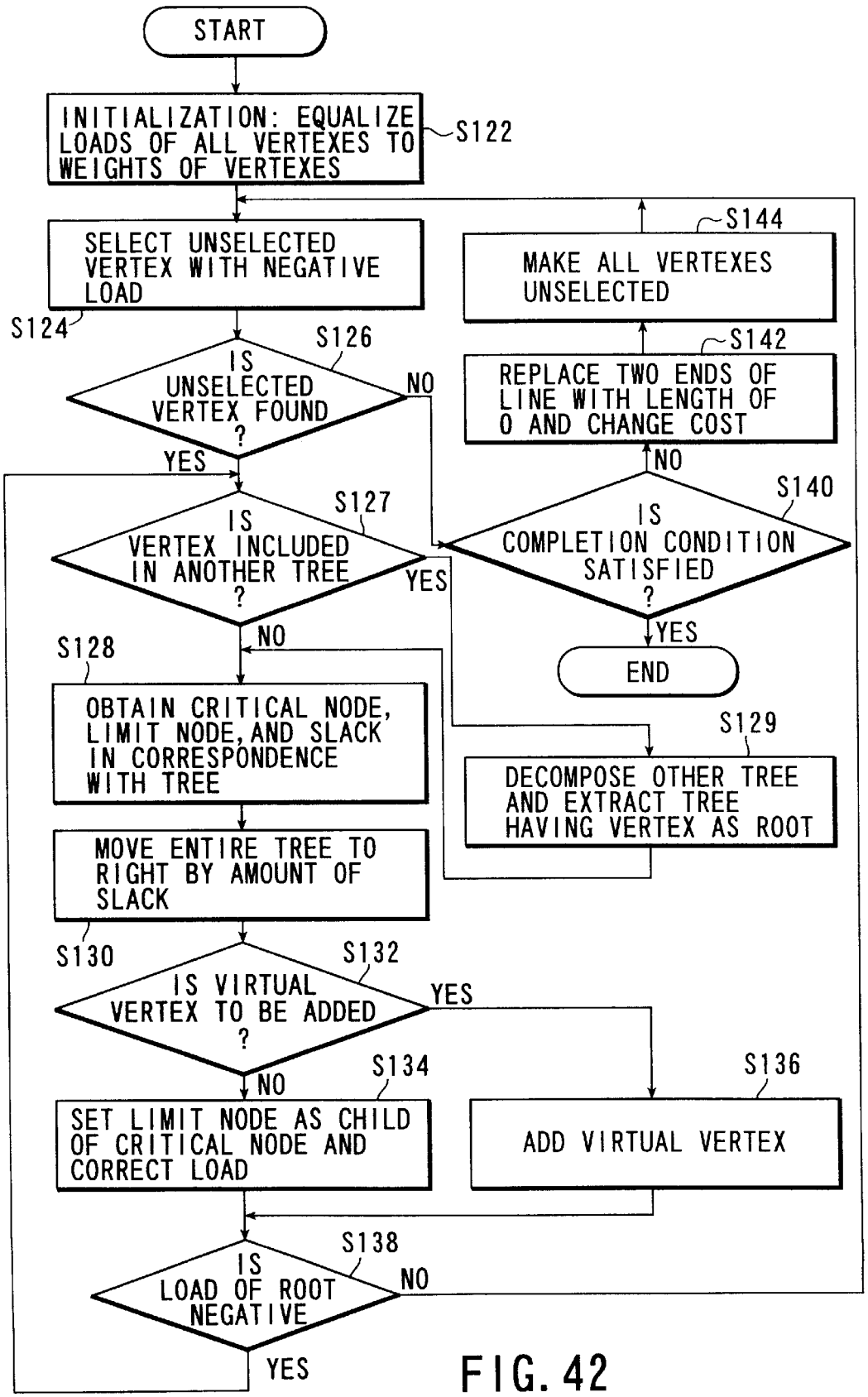
FIG. 42 is a flow chart showing a specific procedure of wire length minimization processing including virtual vertex addition.

(3) Details of Procedure of Wire Length Minimization Including Virtual Vertex Addition Details of the procedure of wire length minimization including addition of the above-described virtual vertex will be described next. FIG. 42 is a flow chart showing the procedure of wire length minimization processing in this embodiment. In this procedure, first, the loads of all vertexes are set at values equal to the weights of the vertexes as initialization (step S122). This is because at the start of processing, all vertexes are not included in a tree and regarded as leaves at ends. Subsequently, the following processing is performed.

The moving section 303 selects, as an object to be moved, an unselected vertex having a negative weight (step S124). A vertex having a negative weight is a movable vertex. Selection of a vertex as a root means that a group of vertexes is selected as an object to be moved. The selected vertex or group will be referred to as a "group being processed" hereinafter. Upon detecting an unselected vertex (step S126), the moving section 303 moves the group being processed in one direction. There is a limit where the group being processed cannot be moved anymore because of the constraint condition between an object of the group being processed and an object outside the group being processed.

The moving section 303 obtains the critical node, the limit node, and the slack in the group (tree) being processed (step S128). The slack represents the margin for moving the group being processed to the right side within the range not violating the condition given to the constraint graph. More specifically, while the group being processed is moving to the right side, a condition for inhibiting movement of the group being processed is found. This condition is the constraint condition between a vertex included in the group being processed and a vertex outside the group being processed. At this time, the vertex included in the group being processed is called a critical node, and the vertex outside the group being processed is called a limit node.

When the moving section 303 moves the group being processed by the resultant slack, i.e., to the limit position (step S130), the group being processed cannot be moved anymore. The moving section 303 stops moving and transfers the information of the limit node to the group generation section 304.

If the limit node notified by the moving section 303 already belongs to another group, the group generation section 304 requests the determining section 305 to determine whether a virtual vertex need be added (step S132).

The determining section 305 compares a group obtained by moving the limit node from the current group to the group being processed with a group obtained by combining the group including the limit node with the group being processed. If the latter group is more advantageous in minimization of the total wire length, the determining section 305 determines that a virtual vertex need be added and calls the virtual vertex addition section 306.

At this time, the determining section 305 designates for the virtual vertex addition section 306 two groups, i.e., the group including the limit node and the group being processed to be integrated by adding a virtual vertex.

The called virtual vertex addition section 306 adds a virtual vertex having, as child nodes, the roots of two trees respectively corresponding to the two groups, i.e., the group being processed and the group including the limit node (step S136), designated by the determining section 305, thereby integrating the two groups.

The virtual vertex addition section 306 transfers the tree having the added virtual vertex as a root to the group generation section 304. On the other hand, when the determining section 305 determines that no virtual vertex need be added, the group generation section 304 sets the limit node notified by the moving section 303 as a child node of the critical node included in the group being processed and corrects the load (step S134), thereby directly integrating the group being processed and the group including the limit node into one group.

The group generation section 304 determines whether the root of the group obtained at step S134 or S136 has a negative load (step S138). If YES at step S138, the obtained group is transferred to the moving section 303, and the moving section 303 performs processing of moving the vertexes again (steps S124 to S130).

If NO at step S138, i.e., when the wire length cannot be minimized even by moving the entire resultant group, and the cost can be reduced by moving some vertexes in the obtained group as a subgroup, the group is divided into subgroups. Specifically, it is determined at step S127 whether or not the vertex v is included in another tree. If YES at step S127, the other tree is decomposed and a subtree having the vertex as a root is extracted at step S129 and step S128 is executed. In this manner, the group generation section 304 determines the next group to be moved and notifies the group to be moved to the moving section 303, and the moving section 303 moves the vertexes.

When the moving section 303 cannot find a movable vertex or vertex group in the constraint graph (step S126), it is determined that the completion condition is satisfied (step S140). If YES at step S140, processing is ended. If NO at step S140, the two ends of a line having a length of 0 are replaced with each other, and then, the (equation representing) cost is rewritten (step S142). All vertexes are returned to the unselected state (step S144), and processing from step S124 is repeated for a constraint graph having a new structure wherein the two ends of the line are replaced. An example wherein replacement of two ends of a line and rewrite of the equation representing the cost are omitted by adding an auxiliary vertex will be described later.

Three examples of actual layout processing according to the procedure shown in FIG. 42 will be described next. A tree is represented as tree (v) using the vertex v as the root of the tree.

FIRST EXAMPLE

Figure 39:
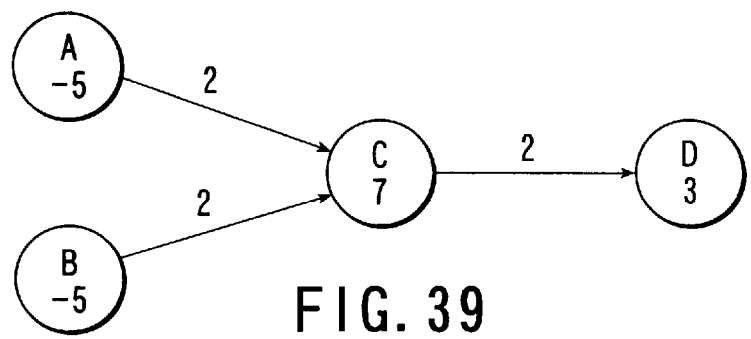
FIG. 39 shows the constraint graph of the layout shown in FIG. 38.
Figure 43:
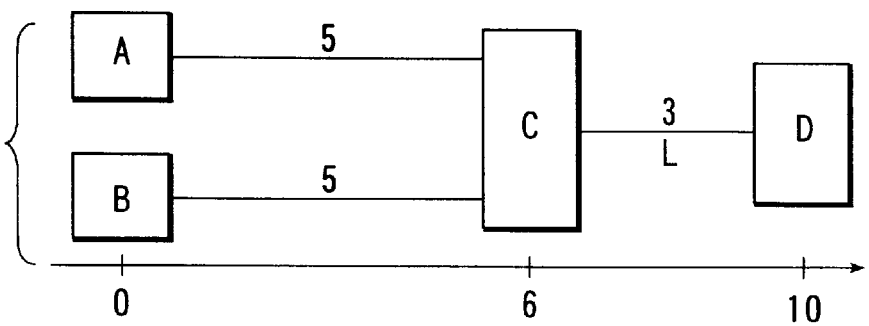
FIG. 43 shows a specific example of a layout to be processed in the second embodiment.

FIG. 43 shows the layout of the first example. The layout shown in FIG. 43 is a state before the state shown in FIG. 38. Assume that the same constraint condition as in the constraint graph of FIG. 39 is set between the objects, i.e., vertexes.

Figure 44:
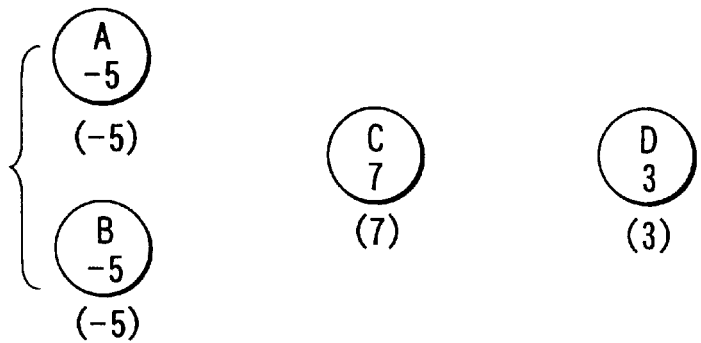
FIG. 44 shows the constraint graph of the layout shown in FIG. 43.

At the start of processing, the positions (x-coordinate values) of the objects A, B, C, and D in the layout shown in FIG. 43 are 0, 0, 6, and 10. In initialization (step S124), the loads of the vertexes are set to be equal to the weights of the vertexes. As a result, the tree shown in FIG. 44 is obtained. In FIG. 44 and other trees, a load is put in parentheses.

Selection of Vertex

An unselected vertex having a negative load is selected (step S124). At this time point, all vertexes are unselected, and one of the vertexes A and B having negative loads is selected. In this example, the vertex A is selected. Even when the vertex B is selected, processing is performed in the same procedure.

It is determined whether an unselected vertex is found (step S126). In this example, the vertex A is found as an unselected vertex. Since YES at step S126, processing of moving the vertex is performed (steps S128 and S130).

Movement of Vertex

Figure 45:
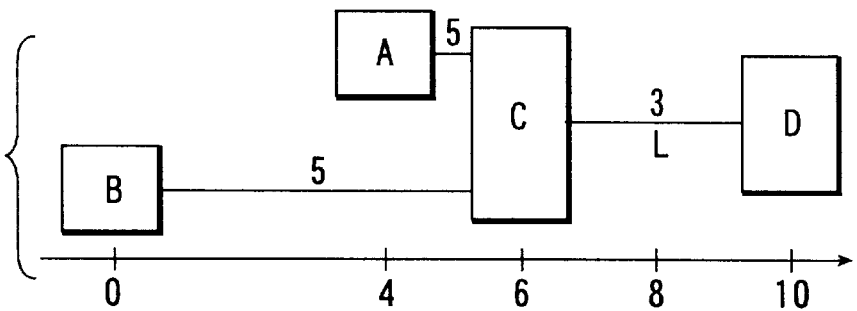
FIG. 45 shows a layout after the vertexes of the layout in FIG. 43 are moved.

In this processing, first, the limit node, the critical node, and the slack in the tree constituted only by the vertex A are obtained. In this example, the tree has only the vertex A, and the vertex C having a constraint condition with respect to the vertex A is the limit node. According to the constraint graph shown in FIG. 39, an interval of 2 must be set between the vertexes A and C. In the layout of FIG. 43, since the position of the vertex A is 0, and the position of the vertex C is 6, the slack is 4. The critical node is the vertex A. The moving section 303 moves the tree having only the vertex A by 4, i.e., the amount of the slack (step S130). As a result, the objects are arranged as shown in FIG. 45.

Determination of Virtual Vertex Addition

It is determined whether a virtual vertex is to be added (step S132). When the following conditions are satisfied, it is determined that a virtual vertex need be added. Let Fa be the load of the root of a tree Ta including the limit node, and FO be the load of the root of a tree TO being processed. As the conditions of virtual vertex addition, the limit node has a parent, and when the limit node is added as a child node of the critical node, the load of the tree TO becomes positive, and simultaneously, Fa+FO<0 holds. In this case, the load FO means a value before the limit node is added to the critical node.

These conditions are based on the following facts. As long as the load of the root of the tree TO is kept negative even when the limit node and its children and grandchildren are added as children and grandchildren of the critical node (parent), the entire cost can be reduced by further moving the tree TO the right side without adding any virtual vertex. For this reason, no virtual vertex need be added.

When the load of the root of the tree TO is positive, and Fa+FO<0 holds after the limit node and its children and grandchildren are added to the critical node, the tree can be further moved to the right side by adding a virtual vertex. Therefore, a virtual vertex is added.

As another reference for determination, a virtual vertex may be added when F1+F0<(the load of the root after the limit node is added as a child of the critical node) holds. Stricter determination can be expected based on this reference. However, the above-described determination reference allows high-speed processing.

Addition of Virtual Vertex

Figure 46:
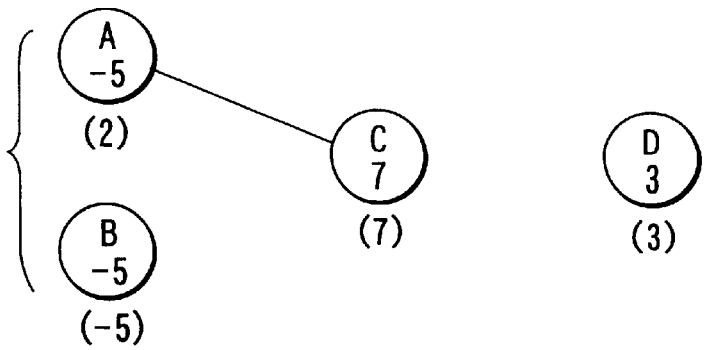
FIG. 46 shows a constraint graph after the load is corrected.

In this example, based on the above determination reference, it is determined that no virtual vertex is to be added. The limit node is added to the critical node, and the load is corrected (step S134). A constraint graph shown in FIG. 46 is obtained. In this state, the load of the vertex A as the root of the tree is positive (2).

Figure 47:
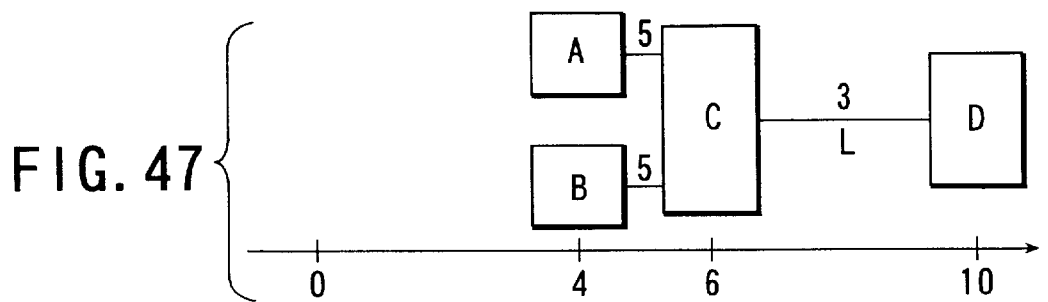
FIG. 47 shows a layout after a virtual vertex is added.

For this reason, it is determined at step S138 that the load of the root is not negative (NO), and the flow returns to step S124. At step S124, the vertex B is selected. Since YES at step S126 (whether an unselected vertex is found), the critical node B, the limit node C, and a slack of 4 is obtained at step S128. At step S130, the tree B having the selected vertex B as the root is moved to the right side by 4, i.e., the amount of the slack. As a result, the objects are arranged as shown in FIG. 47.

Repetition of Processing

Figure 48:
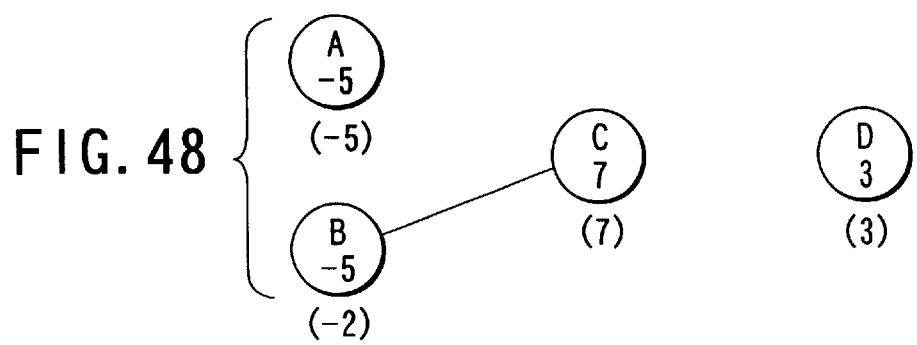
FIG. 48 shows a constraint graph after the virtual vertex is added.
Figure 49:
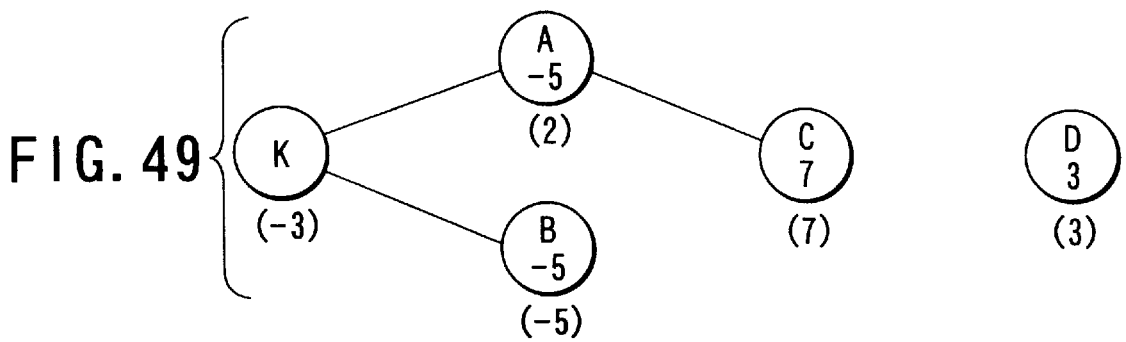
FIG. 49 shows a constraint graph after the virtual vertex is added.

It is determined that a virtual vertex is to be added (step S132) because when the vertex C is removed from the tree A and added to the tree B, the load of the tree B is positive (2), as shown in FIG. 48, and when a virtual vertex is added, the load of the virtual vertex is negative (−3), as shown in FIG. 49.

Figure 50:
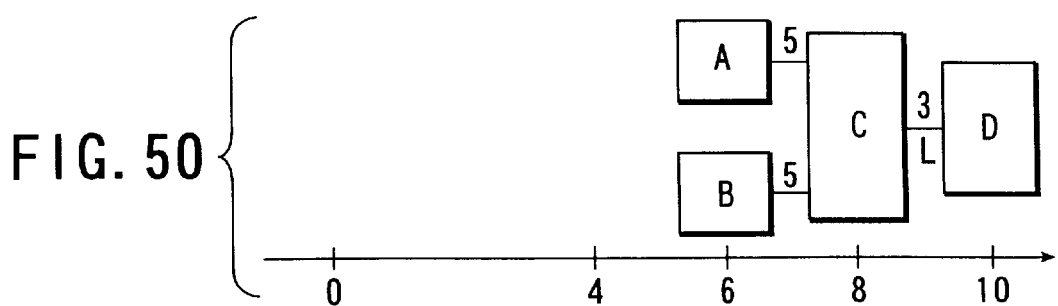
FIG. 50 shows a layout after the virtual vertex is added.

At step S136, a virtual vertex K is added, as shown in FIG. 49. In this case, it is determined at step S138 that the load of the virtual vertex K as the root is negative (YES). The flow returns to step S128 to newly obtain the critical node C, the limit node D, and a slack of 2. For this reason, at step S130 (movement of the tree), the tree (K) is moved to the right side by 2, i.e., the amount of the slack, and as a result, the objects have an arrangement shown in FIG. 50.

Figure 51:
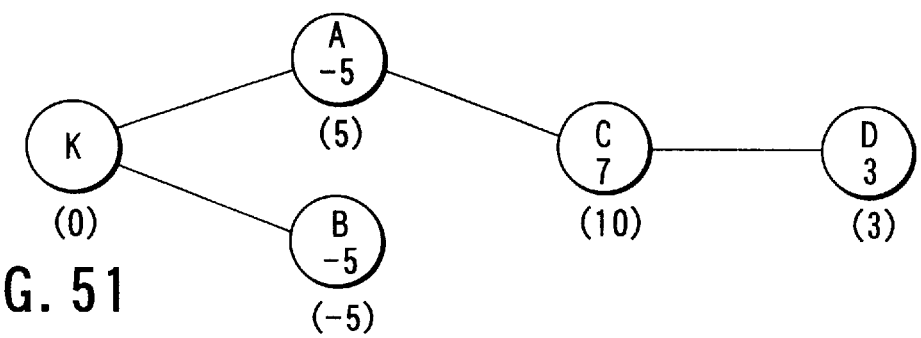
FIG. 51 shows a constraint graph without any added virtual vertex.

In this state, the limit node has no parent. Therefore, at step S132, it is determined that no virtual vertex is to be added (NO). At step S134, the limit node B is added to the critical node C, and a tree shown in FIG. 51 is obtained.

In this state, since the load of the root of the tree (K) having the vertex K as the root is zero, it is determined at step S138 that the load of the root is not negative (NO). The flow returns to step S124. No unselected vertex can be selected this time. For this reason, it is determined at step S126 that no unselected vertex is found (NO). At step S140, the processing completion condition is determined.

Determination of Completion Condition

The completion condition at step S140 is normally set based on the repetition count of wire length minimization processing or wire length. The contents of this example are simple, and assume that the repetition count is 1. It is determined at step S140 that the completion condition is satisfied (YES), and processing is ended. Other than the above completion condition, the cost upon previously determining the completion condition at step S140 may be compared with the current cost. If the cost is decreased, processing may be continued without an end (NO). If the cost does not change, processing may be ended (YES).

SECOND EXAMPLE

Figure 52:
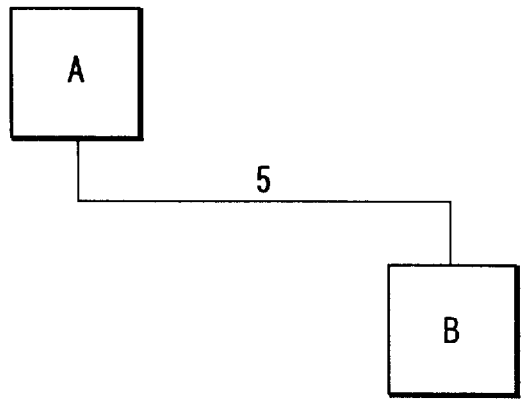
FIG. 52 shows the second specific example of the layout to be processed in the second embodiment.
Figure 53:
FIG. 53 shows the constraint graph of the layout shown in FIG. 52.

In the second example, both an auxiliary vertex and a virtual vertex are used. For example, in the layout shown in FIG. 52, the objects A and B are connected by a wire with priority 5. In this case, on the constraint graph shown in FIG. 53, weights of −5 and 5 are given to vertexes $v_A$ and $v_B$ corresponding to the objects A and B of the layout. As has already been described, the cost corresponds to the product of the wire length and the priority of the wire. The cost corresponding to the constraint graph in FIG. 53 is given by:

$$5(X(B)-X(A))=5X(B)-5X(A) \tag{7}$$

The weight of a vertex is the coefficient of a coordinate value corresponding to each vertex in the above equation.

When the weight of the vertex $v_B$ is positive, the wire length is shortened by moving the vertex $v_B$ to the left side. When the weight of the vertex $v_A$ is negative, the wire length is shortened by moving the vertex $v_A$ to the right side. Therefore, in the constraint graph shown in FIG. 53, when the vertexes $v_A$ and $v_B$ are replaced with each other, the cost is given by:

$$5(X(A)-X(B))=5X(A)-5X(B) \tag{8}$$

Therefore, the weights of the vertexes $v_A$ and $v_B$ must be corrected to 5 and −5, respectively, such that the sign is inverted. That is, when the left and right end points of a line are replaced, the weight values must be rewritten accordingly.

Figure 54:
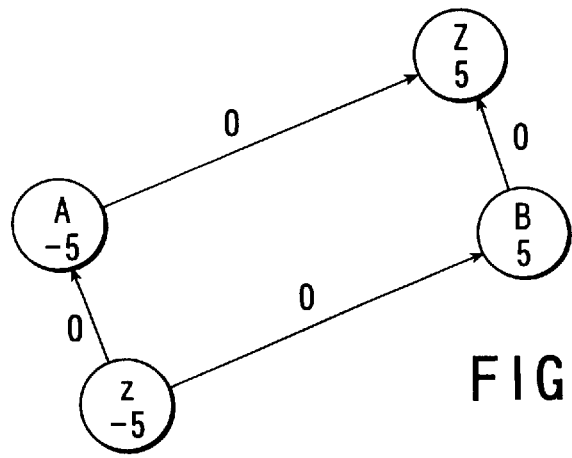
FIG. 54 shows the layout after auxiliary vertexes are added to the layout shown in FIG. 52.

To omit processing of rewriting the weight of a vertex (and the cost) every time the positions of the vertexes $v_A$ and $v_B$ are replaced, auxiliary vertexes $v_Z$ and $v_z$ are introduced. FIG. 54 shows a constraint graph after introduction of the auxiliary vertexes $v_Z$ and $v_z$. In this method, the auxiliary vertex $v_Z$ corresponds to one of the vertexes $v_A$ and $v_B$ which has a larger x-coordinate value, and the auxiliary vertex $v_z$ corresponds to one of the vertexes $v_A$ and $v_B$ which has a smaller x-coordinate value. The branches between vertexes in FIG. 54 represent that the vertexes $v_A$ and $v_B$ are not at a position larger than the auxiliary vertex $v_Z$ or a position smaller than the auxiliary vertex $v_z$.

At this time, the cost is given by:

$$5(X(Z)-X(z))=5X(Z)-5X(z) \qquad (9)$$

In this case, the positions of the auxiliary vertexes $v_Z$ and $v_z$ are not replaced, so the cost need not be corrected during wire length minimization processing. When the auxiliary vertexes are introduced in advance, wire length minimization can be executed without rewriting the cost.

Figure 55:
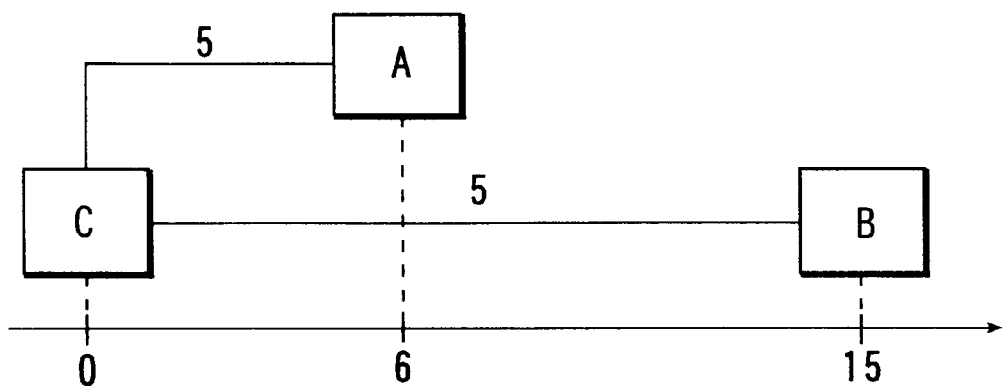
FIG. 55 shows a layout for a comparison between processing in the present invention and processing in the prior art.
Figure 56:
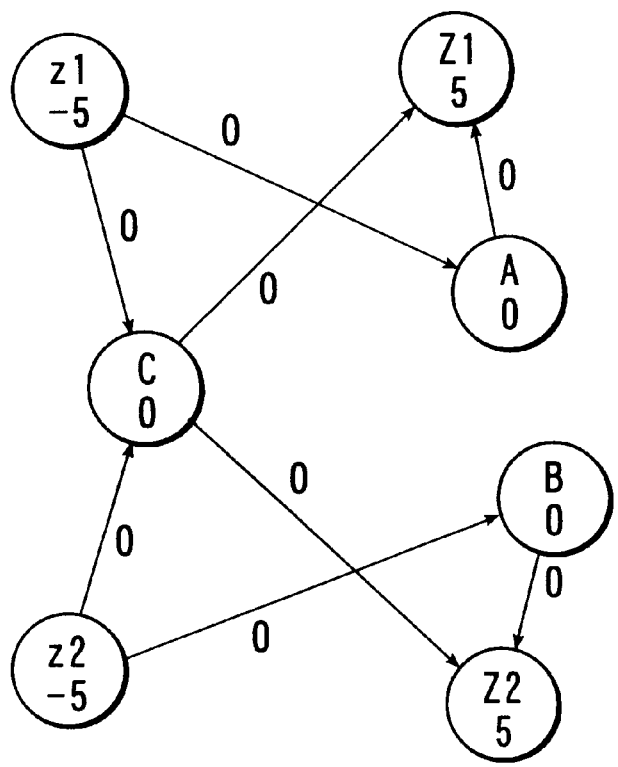
FIG. 56 shows a constraint graph after auxiliary vertexes are added to the layout in FIG. 55.

However, in some cases, even when this prior art is applied, a group of vertexes cannot be stored in the tree structure. FIG. 55 shows such a layout example. FIG. 56 shows a constraint graph generated by adding auxiliary vertexes to the layout shown in FIG. 55. In this example, auxiliary vertexes $v_{z1}$ and $v_{z2}$ have negative weights. However, even when a tree having the auxiliary vertex $v_{z1}$ as the root or a tree having the auxiliary vertex $v_{z2}$ as the root is generated based on the above prior art, one of the auxiliary vertexes cannot be included in the tree, so the optimum solution cannot be obtained.

Figure 57:
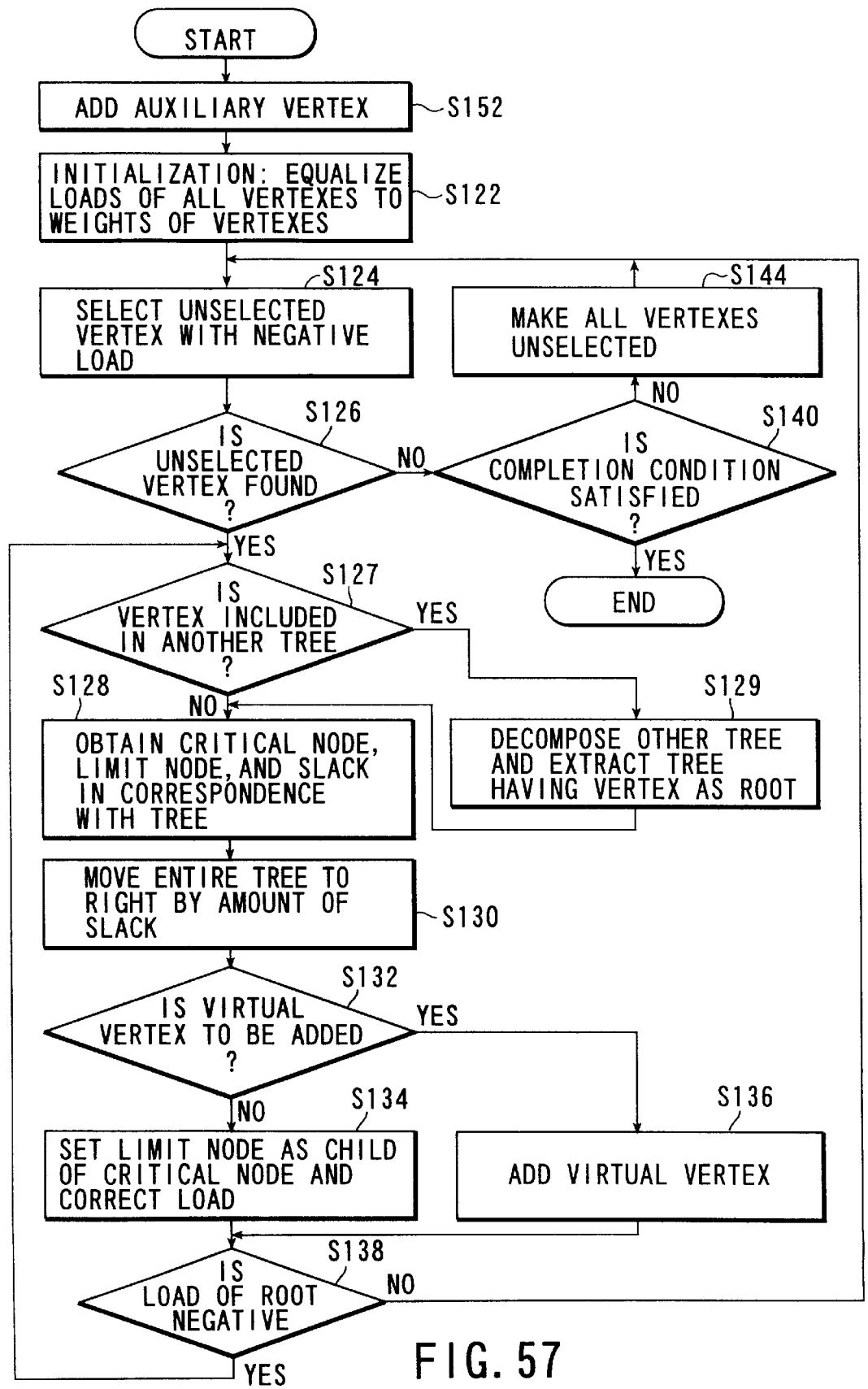
FIG. 57 is a flow chart showing the processing procedure when the auxiliary vertex and the virtual vertex are simultaneously used.

In such a case, these vertexes can be put into a group by adding a virtual vertex. FIG. 57 is a flow chart showing the procedure of processing using both the auxiliary vertex and the virtual vertex.

The flow chart shown in FIG. 57 has, before initialization at step S122 in FIG. 42, step S152 of adding auxiliary vertexes. Accordingly, step S142 of correcting the cost in repetition cycles is deleted, and except these points, the flow chart is the same as in FIG. 42. With this arrangement, the weight of a vertex (and the cost) is not necessarily corrected during processing, so the repetition count can be reduced.

THIRD EXAMPLE

The processing procedure in canceling the constraint violation by the violation cancel section 307 (step S102 in FIG. 36), adding a constraint associated with a wire by the wire constraint condition evaluation section 308 (step S104) in advance, and then performing area minimization (step S106) and wire length minimization (step S108) will be described with reference to an example.

Figure 58:
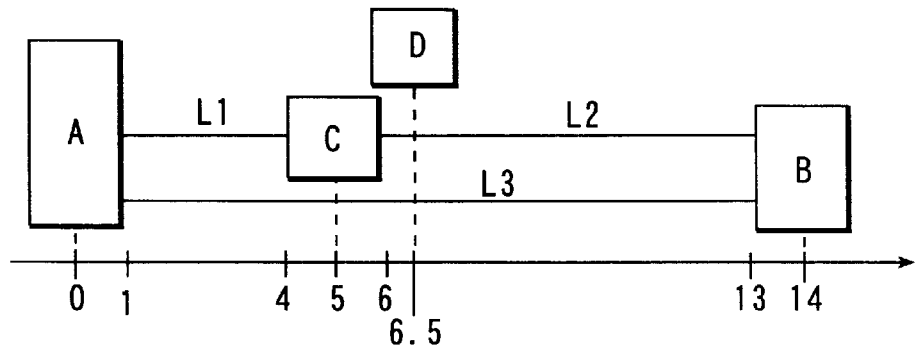
FIG. 58 shows the third specific example of the layout to be processed in the second embodiment.
Figure 59:
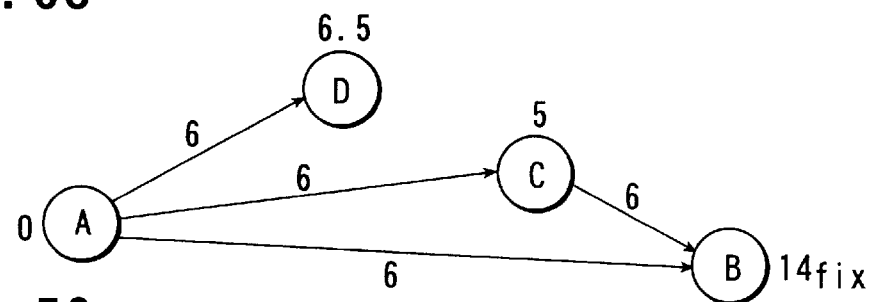
FIG. 59 shows the constraint graph of the layout shown in FIG. 58.

In this example, a layout shown in FIG. 58 is given, and a constraint graph shown in FIG. 59 is created from this layout. In the constraint graph, numbers added to the vertexes $v_A$, $v_B$, $v_C$, and $v_D$ represent the coordinates of the reference points of the positions of the objects A, B, C, and D at that time point. Numbers added to branches between the vertexes are constraint conditions representing intervals to be ensured between the objects.

In the constraint graph shown in FIG. 59, although the interval necessary between the vertexes $v_A$ and $v_C$ is 6, the actual interval is 5, so an interval violation is detected. The violation is canceled by increasing the interval between the vertexes $v_A$ and $v_B$. As the constraint condition, the interval between objects, between an object and a line, or between lines can be freely set.

Figure 60:
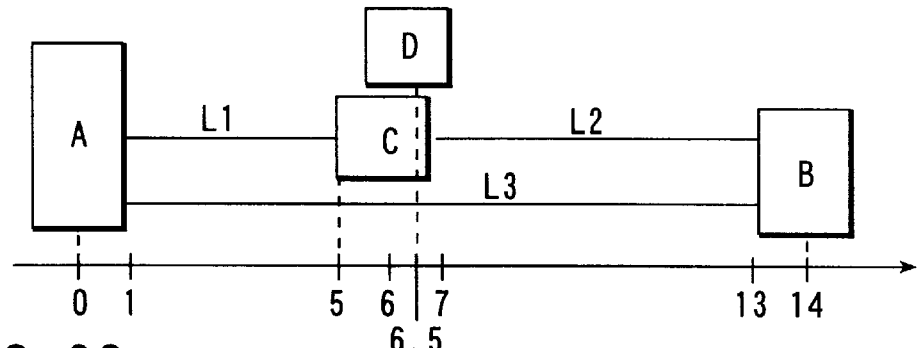
FIG. 60 shows a layout after the interval between vertexes is increased in the layout shown in FIG. 58.
Figure 61:
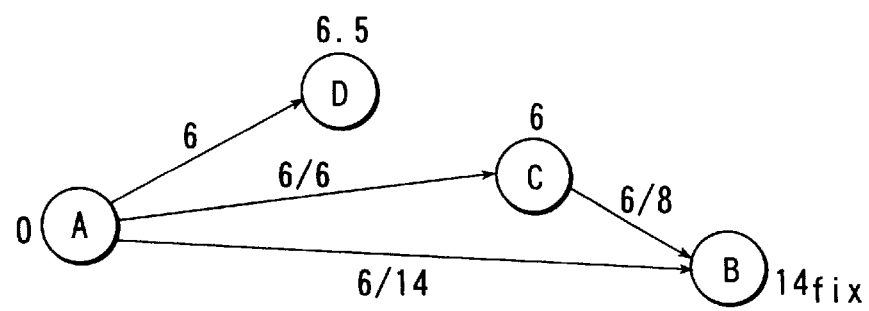
FIG. 61 shows the constraint graph of the layout shown in FIG. 60.

When the interval between the vertexes $v_A$ and $v_C$ is increased, a layout shown in FIG. 60 is obtained. FIG. 61 shows the constraint graph corresponding to the layout. This processing is processing in the horizontal direction (x direction). In the layout shown in FIG. 60, since the objects D and C are too close to each other in the vertical direction (y direction), another violation occurs. In this case, if the object D or C is moved in the x direction to cancel the interval violation, the moving amount increases to result in a layout largely changed from the initial layout. For this reason, such a violation will be canceled later by increasing the interval between the objects D and C in processing in the y direction, and at this time point, the interval between the objects D and C is not increased.

The layout in FIG. 60 has no objects violating the constraint condition in the x direction, so the line length in this state can be set as the upper limit value of the line length. A condition that each line must not extend anymore is added. More specifically, a number (x/y) added to a branch in the constraint graph in FIG. 61 represents that a distance from x to y must be maintained between two objects. For example, since the value of the branch between the vertexes $v_B$ and $v_C$ is 6/8, the interval between the objects B and C must be 6 to 8. When the user allows the line L1 having a length of 6 in FIG. 60 to be increased by 2, the constraint condition set for the branch $v_A$-$v_C$ between the vertexes $v_A$ and $v_C$ is 6/8.

When the line L1 is a diffusion layer, the line L2 is a polysilicon layer, and the line L3 is an aluminum layer, the user can designate the constraint conditions such that the line of the diffusion layer must not extend, the line of the polysilicon layer can extend by 2, and the line of the aluminum layer can freely extend without any constraint condition. In this case, the constraint condition for the branch $v_A$-$v_C$ is 6/6, the constraint condition for the branch $v_C$-$v_B$ is 6/10, the constraint condition for the branch $v_A$-$v_B$ is 6. In this manner, different constraint conditions are set depending on the layer to which the line belongs. As described above, the user can designate the manner of setting the constraint conditions of lines in units of lines or in units of sets to which the lines belong, as needed.

When the upper limit value of the line length is to be set as the constraint condition, and the allowable increase range is to be designated, the current line length can be set as the upper limit value, or an allowable increase amount X may be designated. Alternatively, an allowable increase ratio of Y % may be set in units of lines or in units of sets including lines, and the current line length may be converted using this value to set the upper limit value. The position of the vertex $v_B$, 14, is fixed, and the vertex $v_B$ cannot be moved. The constraint graph shown in FIG. 61 represents it as $14_{fix}$.

Figure 62:
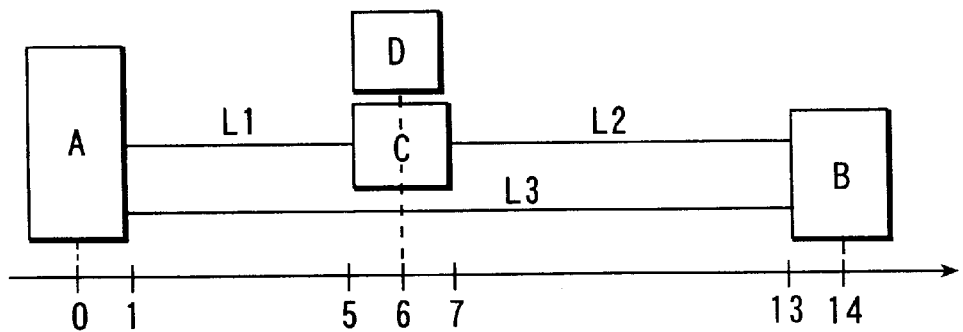
FIG. 62 shows the layout in FIG. 58 after area minimization.
Figure 63:
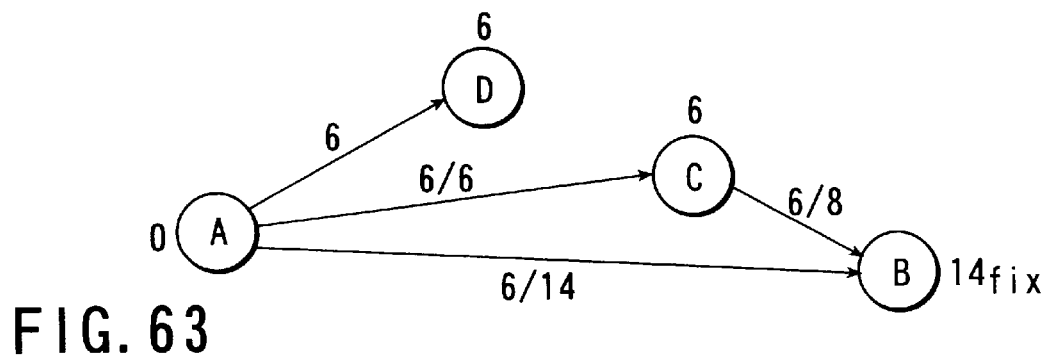
FIG. 63 shows the constraint graph of the layout shown in FIG. 62.

Next of addition of the constraint conditions, area minimization processing is performed. Area minimization is performed by moving the objects to the left side as close as possible. In the constraint graph shown in FIG. 61, the interval between the vertexes $v_A$ and $v_C$ must be 6 because of the constraint condition, and the interval has already been set at 6. The vertex $v_C$ cannot be moved to the left side anymore. The vertex $v_C$ is fixed at the position of 14 and cannot be moved to the left side. It is only the vertex $v_D$ that can be moved to the left. By area minimization, the coordinate of the vertex $v_D$ is corrected from 6.5 to 6, and as a result, a layout shown in FIG. 62 and a constraint graph shown in FIG. 63 are obtained.

Figure 64:
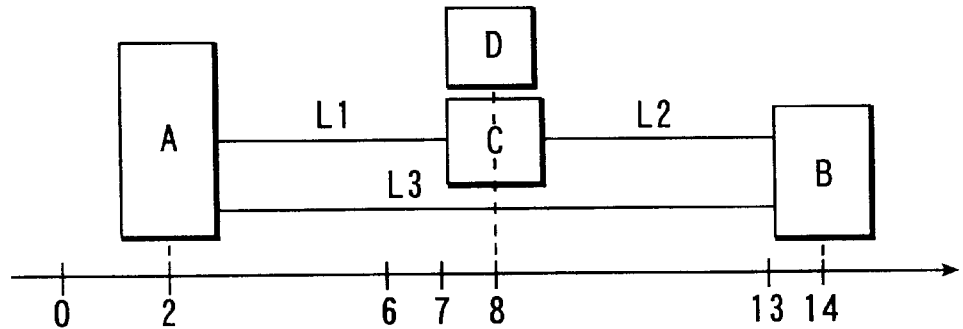
FIG. 64 shows the layout in FIG. 58 after wire length minimization.
Figure 65:
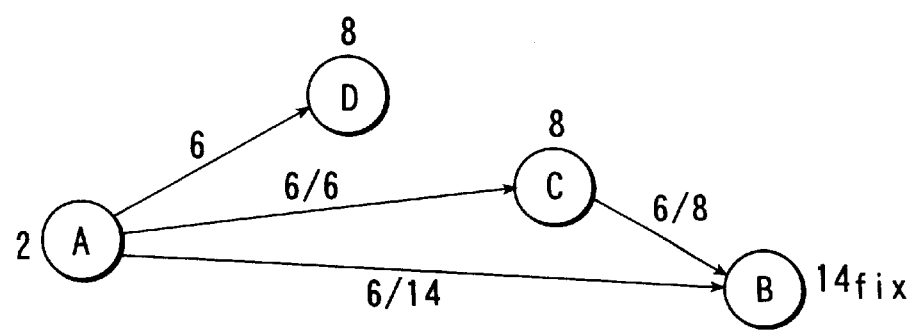
FIG. 65 shows the constraint graph of the layout shown in FIG. 64.

In wire length minimization subsequent to area minimization, processing in the first or second example can be applied to minimize the wire length. As a result, a layout shown in FIG. 64 and a constraint graph shown in FIG. 65 are obtained. By wire length minimization, the object C is positioned almost at the intermediate position between the objects A and B, and an output reflecting the layout pattern in FIG. 60 after violation cancel is obtained.

As described above, in the second embodiment, even a plurality of vertexes which cannot be stored in one tree in the current constraint graph structure because of the positional relationship can be simultaneously moved as a tree by adding a virtual vertex as a common root. For this reason, a variety of combinations of movable vertexes can be obtained, as compared to the prior art, and the wire length can be more effectively minimized.

In this embodiment, since the wire length minimization effect by movement of a vertex or tree is calculated as a load based on the priority of each wire, an important wire can be effectively shortened. That is, as far as a wire with high priority can be shortened, the wire length minimization effect can be enhanced as a whole even when a wire with relatively low priority slightly extend.

In this embodiment, even when a plurality of vertexes can have the same vertex as child nodes, a virtual vertex is added only when an excellent minimization effect is expected. Therefore, the wire length can be more effectively minimized.

In this embodiment, in processing of sequentially moving the vertexes, even when the magnitude relationship between the coordinate values at the two ends of a wire is inverted, the magnitude relationship between the coordinate values of each auxiliary vertex does not change. In calculating the wire length minimization effect as a load or cost from the priority of each wire, when the calculation is performed based on the positional relationship of each auxiliary vertex, the positive and negative signs used in calculation do not change, so the equation need not be rewritten. As a result, the efficiency of processing increases and processing allows quick convergence to an optimum arrangement.

In this embodiment, the variation in line length is limited by a constraint condition based on the line length in the absence of constraint violation. Therefore, an excess change in layout is prevented, and a high-quality layout can be obtained.

In this embodiment, as the upper limit value of the line length, the line length after the violation is canceled can be used. In addition, the allowable increase range or ratio can be used, and processing corresponding to the nature of the layout is allowed.

In this embodiment, lines for which constraint conditions are to be set can be finely determined in units of lines or in units of sets of lines. By limiting the variation in line length mainly for an actually necessary portion, a high-quality layout can be obtained.

In this embodiment, when the layout of a semiconductor object includes a plurality of layers, processing according to the characteristic feature of each layer can be performed such that, e.g., the variation in line length is limited for a high-resistance layer. Therefore, a high-quality layout can be obtained.

The present invention is not limited to the above embodiments, and various changes and modifications can be made. For example, as a layout to be subjected to wire length minimization, not only a semiconductor integrated circuit but also a layout in a desired field such as a power transmission/distribution system can be processed. The priority to be set for each wire between vertexes can be manually designated by the user. Alternatively, different priorities may be automatically set in units of layers to which wires belong.

In calculating the wire length minimization effect, the equations in the above embodiments need not always be used to calculate the cost. A desired equation may be set by the user and used. The number and positions of virtual vertexes to be added to the constraint graph can be freely set. For example, a plurality of trees each having a virtual vertex as the root may be integrated by adding another virtual vertex. The contents of a constraint condition associated with a wire length can also be freely set. For example, the upper limit value of the total length of a plurality of lines may be set.

Generally, the present invention is realized by controlling a computer using a wire length minimization program for realizing the functions of the present invention. A storage medium storing such a wire length minimization program constitutes an embodiment of the present invention.

Generally, the present invention is realized by controlling a computer having peripheral devices using software. In this case, information can be input by an input device such as a keyboard or a mouse and output from an output device such as a CRT device or a printer. Storage devices such as a register, a memory, and an external storage device can temporarily or permanently store information in various formats. A CPU can process or determine the information in accordance with the software and also controls the processing sequence. The software for controlling the computer is generated by combining instructions corresponding to the processing operations described in the specification. The generated software is executed by a processing system such as a compiler or an interpreter to utilize the above-described hardware resources.

Various changes and modifications can be made for embodiments for realizing the present invention. To input/output information between the apparatus of the present invention and an external device, an detachable storage medium such as a floppy disk or a network connection device can be used. The storage medium such as a CD-ROM recording the software for realizing the present invention constitutes an embodiment of the present invention by itself. In addition, the functions of the present invention can be partially realized by a physical electronic circuit such as an LSI.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A wire length minimization method of moving an object and a wire in a wiring pattern formed by connecting objects with wires, in accordance with a load representing a performance of wire length minimization considering a priority of each wire, thereby minimizing a wire length, the method comprising the following steps of:

forming a tree having, as nodes, a plurality of objects having a predetermined positional relationship;

calculating, sequentially from a leaf side of the tree, a load of a parent node based on a load of a child node; and specifying objects and wires corresponding to a tree portion having a root node with a load satisfying a predetermined condition, and moving the specified objects and wires as a whole.

2. A method according to claim 1, in which the predetermined positional relationship defines that two objects are positioned at a limit proximity distance, one of the two objects in the tree portion, which is positioned on a root side is defined as the parent node while the other positioned on a leaf side is defined as the child node, and a load of each leaf node, having no child nodes, is obtained as a weight value which is calculated by subtracting a sum of minimization priorities of line segments each having one end at the node and shortened upon moving the node for a predetermined direction from a sum of minimization priorities of line segments each having one end at the node and extending upon moving the node for a predetermined direction, the load of the parent node having child nodes is obtained by adding all positive loads of the child nodes to the weight value of the parent node, and the predetermined condition to be satisfied by the load of the root node is that the load of the root node has a negative value.

3. A method according to claim 1, in which said method is repeatedly executed until a completion condition including one or a predetermined combination of conditions is satisfied, the conditions including a condition that all objects and wires are not moved for two cycles even when said method is executed, a condition that all objects and wires are not moved even when said method is executed, a condition that a repetition count exceeds a predetermined count, and a condition that a change in cost, which is in accordance with a sum value of weighted line segment lengths of wires, is smaller than a predetermined value.

4. A method according to claim 1, in which said specifying and moving step comprises substeps of:

representing a relationship between two ends of a wire line segment in a constraint graph; and moving the objects and the wires within a range not inverting a positional relationship between two ends of the wire line segment.

5. A method according to claim 1, in which said specifying and moving step comprises substeps of:

moving the objects and the wires within a range not inverting a positional relationship between two ends of a wire line segment; and if a wire line segment has a length of 0 upon completion of movement of the objects and wires, inverting the positional relationship between the two ends of the wire line segment, correcting a structure of the tree, and re-calculating the load.

6. A method according to claim 3, in which said specifying and moving step comprises substeps of:

moving the objects and the wires within a range not inverting a positional relationship between two ends of a wire line segment; and if some wire line segments have a length of 0 when the completion condition is satisfied, then inverting their positional relationships between two ends of the wire line segments and repeatedly executing the moving step until the completion condition is satisfied again.

7. A method according to claim 3, in which said specifying and moving step comprises substeps of:

moving the objects and the wires within a range not inverting a positional relationship between two ends of a wire line segment; and if some wire line segments have a length of 0 or some branches between vertexes corresponding to two ends of wire line segments become tight when the completion condition is satisfied, then merging two ends of their wire segments and repeatedly executing the moving step until the completion condition is satisfied again.

8. A method according to claim 3, in which a portion where a layout of the objects and the wires is changed is specified, and a convergence state is presented in a first form displaying a difference between the layout before change an that after change or a second form displaying at least one of a value of a difference of total wire length and that of the cost, and a repetition count input by a user is used as the completion condition.

9. A method according to claim 1, in which the minimization priority of each wire line segment is represented as a function of a length of the wire line segment, a width of the wire line segment, and a mask layer to which the wire line segment belongs.

10. A method according to claim 1, in which a specific design rule and the priority of each wire can be set for only a specific portion of the wiring pattern.

11. A wire length minimization method according to claim 1, wherein said specifying and moving step comprising the following substeps of:

moving vertexes representing the objects or wires in a constraint graph representing an arrangement of the objects and wires in the layout and a constraint condition associated with the arrangement;

forming a tree which contains vertexes which should move simultaneously; and adding a virtual vertex having the plurality of vertexes as children when a plurality of vertexes can have the same vertex as a child, thereby generating a tree including the plurality of vertexes as a tree to be moved.

12. A method according to claim 11, in which said moving step comprises a substep of calculating a wire length minimization effect generated by moving each object and wire in a specific direction, based on a priority set for each wire in advance.

13. A method according to claim 11, in which when an improved wire length minimization effect is obtained by moving a tree having, as a root, the virtual vertex to be added than by moving a tree having, as a root, one of the plurality of vertexes, said adding step adds the virtual vertex.

14. A method according to claim 11, further comprising step of adding, to the constraint graph, a first auxiliary vertex corresponding to one of two end points of a line representing one of wires, which has a larger coordinate value, and a second auxiliary vertex corresponding to the other end point which has a smaller coordinate value.

15. A wire length minimization method according to claim 1 further comprising the following steps of:

canceling a violation to a constraint condition included in a given layout; and adding a constraint condition for limiting a variation in a length of a line included in wires of the layout, said forming step, calculating step, and specifying and moving step following the adding step.

16. A method according to claim 15, in which the constraint condition for limiting the variation of a line length, as an upper limit value of the line length, which is defined by a line length after the violation is canceled or which is obtained by converting the line length using a value set for each lines or for each set of lines.

17. A method according to claim 15, in which said adding step comprises step of determining, in units of lines or in units of sets of lines, whether the constraint condition for limiting the variation in the line length is to be added.

18. A method according to claim 16, in which each set of lines is constituted by lines belonging to one of a plurality of layers included in the layout.

19. A wire length minimization method according to claim 11, further comprising the following steps of:

canceling a violation to a constraint condition included in a given layout; and adding a constraint condition for limiting a variation in a length of a line included in wires of the layout.

20. A method according to claim 19, in which the constraint condition for limiting the variation of a line length, as a upper limit value of the line length, which is defined by a line length after the violation is canceled or which is obtained by converting the line length using a value set for each lines or for each set of lines.

21. A method according to claim 19, in which said adding step comprises step of determining, in units of lines or in units of sets of lines, whether the constraint condition for limiting the variation in the line length is to be added.

22. A method according to claim 20, in which each set of lines is constituted by lines belonging to one of a plurality of layers included in the layout.

23. A wire length minimization apparatus for moving an object and a wire in a wiring pattern formed by connecting objects with wires, in accordance with a load representing a performance of wire length minimization considering a priority of each wire, thereby minimizing a wire length, the apparatus comprising:

means for forming a tree having, as nodes, a plurality of objects having a predetermined positional relationship;

means for calculating, sequentially from a leaf side of the tree, a load of a parent node based on a load of a child node; and means for specifying objects and wires corresponding to a tree portion having a root node with a load satisfying a predetermined condition, and moving the specified objects and wires as a whole.

24. A wire length minimization apparatus according to claim 23, wherein said specifying and moving means comprising:

means for moving vertexes representing the objects or wires in a constraint graph representing an arrangement of the objects and wires in the layout and a constraint condition associated with the arrangement;

means for forming a tree which contains vertexes which should move simultaneously; and means for adding a virtual vertex having the plurality of vertexes as children when a plurality of vertexes can have the same vertex as a child, thereby generating a tree including the plurality of vertexes as a tree to be moved.

25. A wire length minimization apparatus according to claim 23 further comprising:

means for canceling a violation to a constraint condition included in a given layout; and means for adding a constraint condition for limiting a variation in a length of a line included in wires of the layout.

26. A wire length minimization apparatus according to claim 24, further comprising:

means for canceling a violation to a constraint condition included in a given layout; and means for adding a constraint condition for limiting a variation in a length of a line included in wires of the layout.

27. A computer readable storage medium which stores a wire length minimization program for moving an object and a wire in a wiring pattern formed by connecting objects with wires, in accordance with a load representing a performance of wire length minimization considering a priority of each wire, thereby minimizing a wire length, the program comprising:

computer readable program code means for forming a tree having, as nodes, a plurality of objects having a predetermined positional relationship;

computer readable program code means for calculating, sequentially from a leaf side of the tree, a load of a parent node based on a load of a child node; and computer readable program code means for specifying objects and wires corresponding to a tree portion having a root node with a load satisfying a predetermined condition, and moving the specified objects and wires as a whole.

28. A computer readable storage medium according to claim 27, further comprising:

computer readable program code means for moving vertexes representing the objects of wires to minimize a wire length in a constraint graph representing an arrangement of the objects and wires in the layout and a constraint condition associated with the arrangement;

computer readable program code means for forming a tree which contains vertexes which should move simultaneously; and computer readable program code means for adding a virtual vertex having the plurality of vertexes as children when a plurality of vertexes can have the same vertex as a child, thereby generating a tree including the plurality of vertexes as a tree to be moved.

29. A computer readable storage medium according to claim 27, further comprising:

computer readable program code means for canceling a violation to a constraint condition included in a given layout; and computer readable program code means for adding a constraint condition for limiting a variation in a length of a line included in wires of the layout.

30. A computer readable storage medium according to claim 28, further comprising:

computer readable program code means for canceling a violation to a constraint condition included in a given layout; and computer readable program code means for adding a constraint condition for limiting a variation in a length of a line included in wires of the layout.

31. A wire length minimization method of minimizing a length of a wire connecting objects included in a given layout, in accordance with a load representing a performance of wire length minimization considering a priority of each wire, thereby minimizing a wire length, the method comprising the following steps of:

moving vertexes representing the objects or wires to minimize a wire length in a constraint graph representing an arrangement of the objects and wires in the layout;

forming a tree which contains vertexes which should move simultaneously; and adding a virtual vertex to the tree if a plurality of vertexes have the same vertex as a child such that the virtual vertex has the plurality of vertexes as a children, thereby generating a new tree including the virtual vertex as a root and the plurality of vertexes as the children.

32. A method according to claim 31, in which said moving step comprises a substep of calculating a wire length minimization effect generated by moving each object and wire in a specific direction, based on a priority set for each wire in advance.

33. A method according to claim 31, in which when an improved wire length minimization effect is obtained by moving a tree having, as a root, the virtual vertex to be added than by moving a tree having, as a root, one of the plurality of vertexes, said adding steps adds the virtual vertex.

34. A method according to claim 31, further comprising step of adding, to the constraint graph, a first auxiliary vertex corresponding to one of two end points of a line representing one of wires, which has a larger coordinate value, and a second auxiliary vertex corresponding to the other end point which has a smaller coordinate value.

35. A wire length minimization apparatus for minimizing a length of a wire connecting objects included in a given layout, in accordance with a load representing a performance of wire length minimization considering a priority of each wire, thereby minimizing a wire length, the apparatus comprising:

means for moving vertexes representing the objects or wires to minimize a wire length in a constraint graph representing an arrangement of the objects and wires in the layout and a constraint condition associated with the arrangement;

means for forming a tree which contains vertexes which should move simultaneously; and means for adding a virtual vertex to the tree if a plurality of vertexes have the same vertex as a child that such the virtual vertex has the plurality of vertexes as children, thereby generating a new tree including the virtual vertex as a root and the plurality of vertexes as the children.

36. A computer readable storage medium which stores a wire length minimization program for minimizing a length of a wire connecting objects included in a given layout, in accordance with a load representing a performance of wire length minimization considering a priority of each wire, thereby minimizing a wire length, the program comprising:

computer readable program code means for moving vertexes representing the objects or wires to minimize a wire length in a constraint graph representing an arrangement of the objects and wires in the layout and a constraint condition associated with the arrangement;

computer readable program code means for forming a tree which contains vertexes which should move simultaneously; and computer readable program code means for adding a virtual vertex to the tree if a plurality of vertexes have the same vertex as a child such that the virtual vertex has the plurality of vertexes as children, thereby generating a new tree including the virtual vertex as a root and the plurality of vertexes as the children.

* * * * *

UNITED STATES PATENT AND TRADEMARK OFFICE
CERTIFICATE OF CORRECTION

PATENT NO. : 6,122,443
DATED : September 19, 2000
INVENTOR(S) : Takeichiro Nishikawa It is certified that error appears in the above-identified patent and that said Letters Patent is hereby corrected as shown below:

Column 34, claim 8,
Line 2, "change an" should read -- change and --.

Column 34, claim 16,
Line 60, "each lines" should read -- each line --.

Column 35, claim 20,
Line 9, "a upper limit" should read -- an upper limit --.
Line 12, "each lines" should read -- each line --.

Column 36, claim 28,
Line 19, "objects of wires" should read -- objects or wires --.

Column 36, claim 31,
Line 62, before "children", delete "a".

Column 37, claim 33,
Line 8, "steps adds" should read -- step adds --.

Signed and Sealed this

Second Day of April, 2002

*Attest:*

*Attesting Officer*

JAMES E. ROGAN
*Director of the United States Patent and Trademark Office*